(12) United States Patent
Winkels et al.

(10) Patent No.: US 10,904,994 B2
(45) Date of Patent: Jan. 26, 2021

(54) SUPPLY SYSTEM FOR AN EXTREME ULTRAVIOLET LIGHT SOURCE

(71) Applicant: ASML Netherlands B.V., Veldhoven (NL)

(72) Inventors: Koen Gerhardus Winkels, Eindhoven (NL); Georgiy O. Vaschenko, San Diego, CA (US); Theodorus Wilhelmus Driessen, San Diego, CA (US); Johan Frederik Dijksman, Weert (NL); Bastiaan Lambertus Wilhelmus Marinus van de Ven, Rosmalen (NL); Wilhelmus Henricus Theodorus Maria Aangenent, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/671,348

(22) Filed: Nov. 1, 2019

(65) Prior Publication Data

US 2020/0128657 A1    Apr. 23, 2020

Related U.S. Application Data

(63) Continuation of application No. 15/962,307, filed on Apr. 25, 2018, now Pat. No. 10,499,485.

(Continued)

(51) Int. Cl.
*H05G 2/00* (2006.01)
*B81C 1/00* (2006.01)
*G03F 7/20* (2006.01)

(52) U.S. Cl.
CPC ......... *H05G 2/008* (2013.01); *B81C 1/00134* (2013.01); *G03F 7/70033* (2013.01);
(Continued)

(58) Field of Classification Search
CPC ........ H05G 2/008; H05G 2/005; H05G 2/006; B81C 1/00134; B81C 2201/0132; G03F 7/70033
See application file for complete search history.

(56) References Cited

U.S. PATENT DOCUMENTS 6,019,457 A    2/2000  Silverbrook
8,816,305 B2   8/2014  De Dea et al.
(Continued)

FOREIGN PATENT DOCUMENTS

WO    2014082811 A1   6/2014
WO    2017102931 A1   6/2017

OTHER PUBLICATIONS

"Microelectromechanical systems," Wikipedia, the free encyclopedia, https://en.wikipedia.org/wiki/Microelectromechanical_systems, last edited on Jun. 9, 2017, downloaded on Jun. 9, 2017, 11 pages.

(Continued)

*Primary Examiner* — Nicole M Ippolito
*Assistant Examiner* — Hanway Chang
(74) *Attorney, Agent, or Firm* — DiBerardino McGovern IP Group LLC

(57) ABSTRACT

A supply system for an extreme ultraviolet (EUV) light source includes an apparatus configured to be fluidly coupled to a reservoir configured to contain target material that produces EUV light in a plasma state, the apparatus including two or more target formation units, each one of the target formation units including: a nozzle structure configured to receive the target material from the reservoir, the nozzle structure including an orifice configured to emit the target material to a plasma formation location. The supply system further includes a control system configured to select a particular one of the target formation units for emitting the target material to the plasma formation location. An appa- (Continued)

ratus for a supply system of an extreme ultraviolet (EUV) light source includes a MEMS system fabricated in a semiconductor device fabrication technology, and the MEMS system including a nozzle structure configured to be fluidly coupled to a reservoir.

28 Claims, 15 Drawing Sheets

Related U.S. Application Data

(60) Provisional application No. 62/522,383, filed on Jun. 20, 2017.

(52) U.S. Cl.
CPC .............. *H05G 2/005* (2013.01); *H05G 2/006* (2013.01); *B81C 2201/0132* (2013.01)

(56) References Cited

U.S. PATENT DOCUMENTS

| | | |
|---|---|---|
| 9,029,813 B2 | 5/2015 | Fomenkov et al. |
| 9,392,678 B2 | 7/2016 | De Dea et al. |
| 9,442,380 B2 | 9/2016 | Badie et al. |
| 2002/0113839 A1 | 8/2002 | Hawkins et al. |
| 2006/0017026 A1 | 1/2006 | Hergenhan et al. |
| 2006/0255298 A1 | 11/2006 | Bykanov et al. |
| 2008/0284827 A1 | 11/2008 | Fagerquist et al. |
| 2013/0153603 A1 | 6/2013 | De Dea et al. |
| 2014/0151582 A1 | 6/2014 | Rollinger et al. |
| 2014/0209817 A1 | 7/2014 | Hultermans et al. |
| 2015/0022592 A1 | 1/2015 | Aoyama et al. |
| 2015/0264791 A1 | 9/2015 | Nikipelov et al. |

OTHER PUBLICATIONS

S. Sanchez et al., "Spontaneous direct bonding of thick silicon nitride," J. Micromech. Mircoeng. 7 (1997), pp. 111-113, PII: S0960-1317(97)83107-5, presented on Oct. 21, 1996, accepted for publication on Apr. 7, 1997.

A. Plopßl et al., "Wafer direct bonding: tailoring adhesion between brittle materials," Materials Science ad Engineering, R25 (1999) pp. 1-88, PII: S0927-796X(98)00017-5, 1999, Elsevier Science S.A.

K. Reck et al., "Fusion bonding of silicon nitride surfaces," Journal of Micromechanics and Microengineering, vol. 21, No. 12 (Nov. 22, 2011), 6 pages.

Anne Sigismund, European International Searching Authority, Invitation to Pay Additional Fees, counterpart PCT Application No. PCT/EP2018/066161, dated Sep. 19, 2018, 18 pages total.

Anne Sigismund, European International Searching Authority, International Search Report and Written Opinion, counterpart PCT Application No. PCT/EP2018/066161, dated Nov. 14, 2018, 20 pages total.

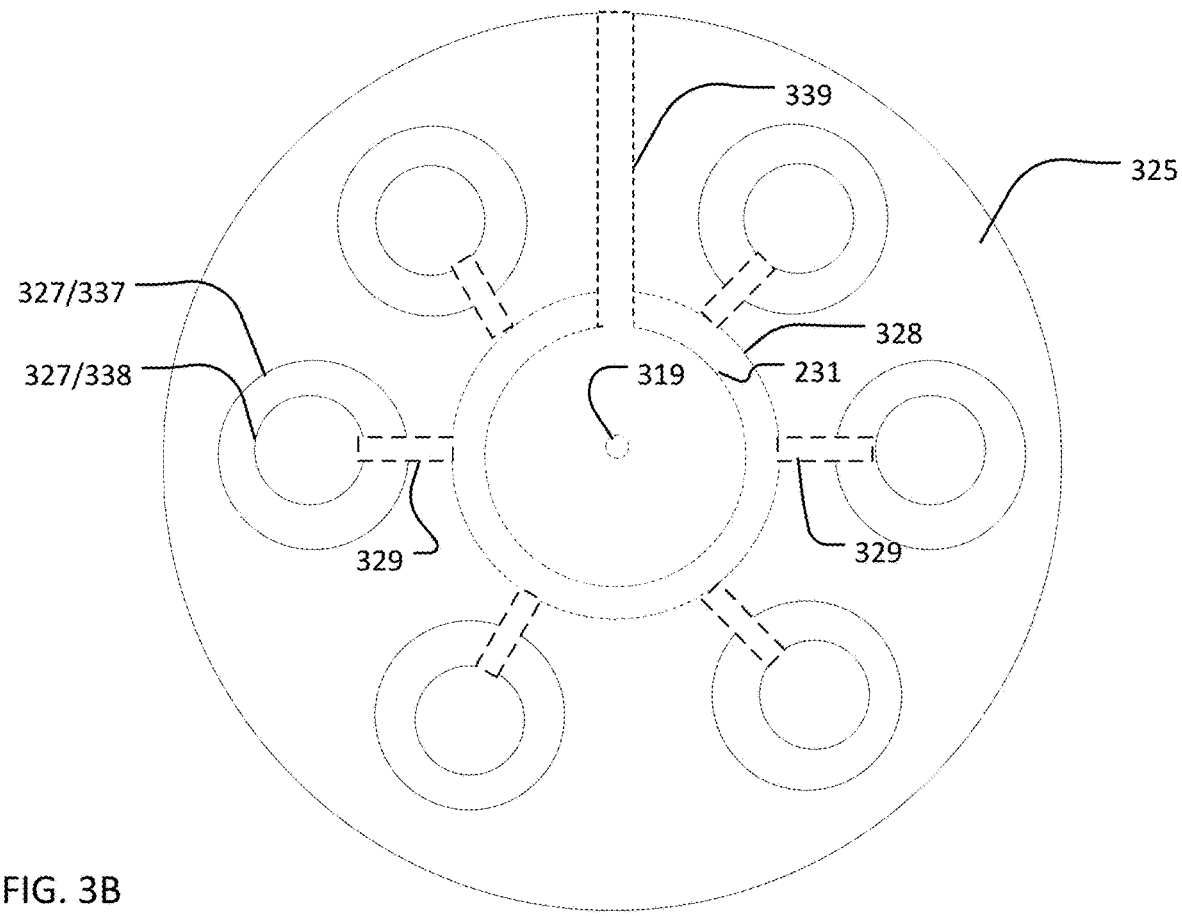
FIG. 3B
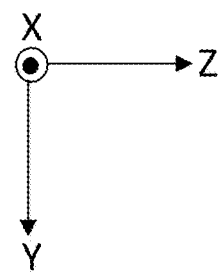

SUPPLY SYSTEM FOR AN EXTREME ULTRAVIOLET LIGHT SOURCE

CROSS REFERENCE TO RELATED APPLICATION

This application is a continuation of U.S. application Ser. No. 15/962,307, filed Apr. 25, 2018 and titled SUPPLY SYSTEM FOR AN EXTREME ULTRAVIOLET LIGHT SOURCE, which claims the benefit of U.S. application Ser. No. 62/522,383, filed Jun. 20, 2017 and titled SUPPLY SYSTEM FOR AN EXTREME ULTRAVIOLET LIGHT SOURCE. Both of these applications are incorporated herein by reference in their entireties.

TECHNICAL FIELD

This disclosure relates to a supply system for an extreme ultraviolet light source.

BACKGROUND

Extreme ultraviolet ("EUV") light, for example, electromagnetic radiation having wavelengths of 100 nanometers (nm) or less (also sometimes referred to as soft x-rays), and including light at a wavelength of, for example, 20 nm or less, between 5 and 20 nm, or between 13 and 14 nm, may be used in photolithography processes to produce extremely small features in substrates, for example, silicon wafers, by initiating polymerization in a resist layer.

Methods to produce EUV light include, but are not necessarily limited to, converting a material that includes an element, for example, xenon, lithium, or tin, with an emission line in the EUV range in a plasma state. In one such method, often termed laser produced plasma ("LPP"), the required plasma may be produced by irradiating a target material, for example, in the form of a droplet, plate, tape, stream, or cluster of material, with an amplified light beam that may be referred to as a drive laser. For this process, the plasma is typically produced in a sealed vessel, for example, a vacuum chamber, and monitored using various types of metrology equipment.

SUMMARY

In one general aspect, a supply system for an extreme ultraviolet (EUV) light source includes an apparatus configured to be fluidly coupled to a reservoir configured to contain target material that produces EUV light in a plasma state, the apparatus including two or more target formation units, each one of the target formation units including: a nozzle structure configured to receive the target material from the reservoir, the nozzle structure including an orifice configured to emit the target material to a plasma formation location. The supply system further includes a control system configured to select a particular one of the target formation units for emitting the target material to the plasma formation location.

Implementations may include one or more of the following features. The control system may include a temperature system configured to control an amount of heat in the apparatus, the control system being configured to select the particular target formation unit for activation or deactivation by controlling the temperature system. The temperature system may include two or more heaters, and each target formation unit may be associated with one or more of the heaters. The control system may be configured to select the particular target formation unit for activation by controlling the one or more particular ones of the heaters associated with the particular target formation unit. A thermally insulating material may be disposed between any two of the target formation units. In some implementations, the temperature system includes two or more active temperature control mechanisms, each target formation unit is associated with one or more of the active temperature control mechanisms, and the one or more active temperature control mechanisms associated with a target formation unit are configured to heat or cool that target formation unit.

Each target formation unit may further include a channel between the reservoir and the orifice, and one or more filters in the channel. Each target formation unit may further include an actuation chamber fluidly coupled to the channel and a modulator coupled to the actuation chamber, the modulator configured to modulate a pressure in the actuation chamber. The channel of each target formation unit may include more than one branch extending from a first end of the respective target formation unit facing the reservoir to the actuation chamber, and an outlet channel fluidly coupled to the actuation chamber, the outlet channel extending from the actuation chamber to the orifice.

The apparatus configured to be fluidly coupled to a reservoir may be a MEMS system fabricated in a semiconductor device fabrication technology. The apparatus configured to be fluidly coupled to a reservoir may be an integral, single piece. The single, integral piece may be a microelectromechanical (MEMS) system fabricated in a semiconductor device fabrication technology.

In some implementations, the supply system also includes a holder accommodating the apparatus. The apparatus and the holder may be configured to move relative to each other. The holder may be configured to move relative to the plasma formation location. Each target formation unit of the apparatus may include at least one of a plurality of capillary tubes, and the plurality of capillary tubes may extend away from the holder.

The control system may be configured to select the particular target formation unit based on one or more of: (a) an indication of an amount of the EUV light produced at the plasma formation location, (b) an indication of an absence of target material at the plasma formation location, and (c) an input from a human operator.

In some implementations, each target formation unit further includes an actuation chamber fluidly coupled to the orifice and a modulator coupled to the actuation chamber. The modulator may be configured to modulate a pressure in the actuation chamber. The control system may be further configured to drive the actuator of the particular target formation unit at two or more frequencies, at least one of the frequencies being based on a geometric configuration of the particular target formation unit.

In another general aspect, an apparatus for a supply system of an extreme ultraviolet (EUV) light source includes a MEMS system configured to be accommodated in a housing of the supply system. The supply system is configured to supply a target material to a plasma formation location. The MEMS system is fabricated in a semiconductor device fabrication technology. The MEMS system includes a nozzle structure configured to be fluidly coupled to a reservoir that is configured to contain the target material that produces EUV light in a plasma state, the nozzle structure including an orifice configured to emit the target material to the plasma formation location.

Implementations may include one or more of the following features. The MEMS system may further include: a channel between the reservoir and the orifice; and one or more filters in the channel. The MEMS system may further include: a channel between the reservoir and the orifice; a chamber fluidly coupled to the channel, the chamber configured to receive the target material from the channel; and a modulator coupled to the chamber, the modulator configured to modulate a pressure in the chamber. The channel may include one or more supply channels fluidly coupled to the chamber, and an outlet channel fluidly coupled to the chamber and the orifice. In operational use, the modulator may be under substantially the same pressure or partial pressure as that of the target material in the chamber.

In another general aspect, an EUV source includes an optical source configured to produce an optical beam; a vessel configured to receive the optical beam at a plasma formation location; and a supply system. The supply system includes: an apparatus configured to be fluidly coupled to a reservoir configured to contain target material that produces EUV light in a plasma state, the apparatus including two or more target formation units, each one of the target formation units including: a nozzle structure configured to receive the target material from the reservoir, the nozzle structure including an orifice configured to emit the target material to the plasma formation location; and a control system configured to select a particular one of the target formation units for emitting the target material to the plasma formation location. The optical beam produced by the optical source is configured to convert the emitted target material to plasma.

Implementations may include one or more of the following features. The control system may include a temperature system configured to control an amount of heat in the apparatus, the control system being configured to select the particular target formation unit for activation or deactivation by controlling the temperature system. The temperature system may include two or more heaters. Each target formation unit may be associated with one or more of the heaters, and the control system may be configured to select the particular target formation unit for activation by controlling the one or more particular ones of the heaters associated with the particular target formation unit.

The apparatus configured to be fluidly coupled to a reservoir may be a single, integral piece. The apparatus configured to be fluidly coupled to a reservoir may be fabricated in a semiconductor device fabrication technology.

Implementations of any of the techniques described above may include an EUV light source, a system, a method, a process, a device, or an apparatus. The details of one or more implementations are set forth in the accompanying drawings and the description below. Other features will be apparent from the description and drawings, and from the claims.

DRAWING DESCRIPTION

FIG. 3B is a block diagram of a top view of the MEMS system of FIG. 3A as seen from the line 3B-3B.

DETAILED DESCRIPTION

Figure 1:
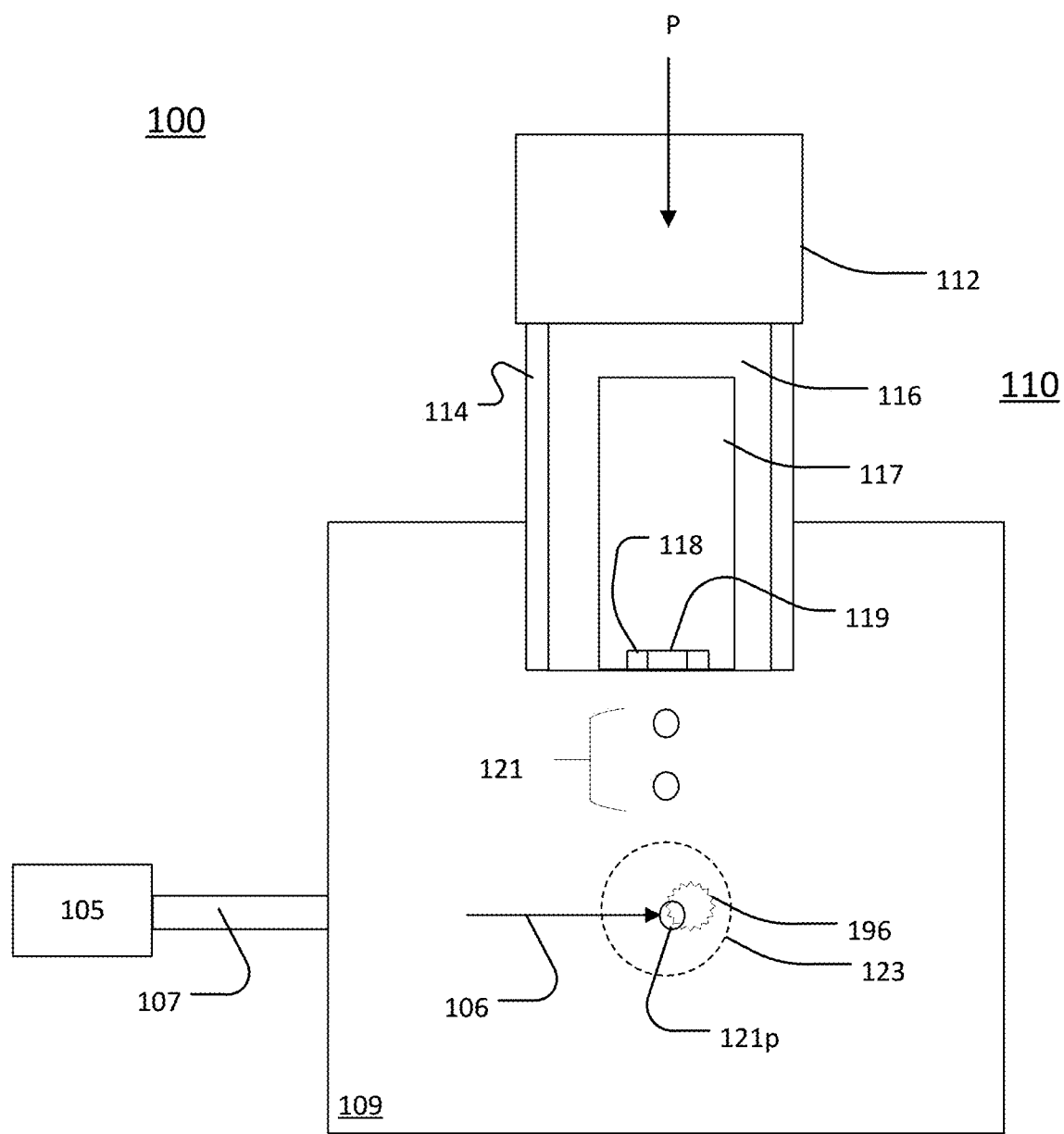
FIG. 1 is a block diagram of an example of a supply system for an EUV light source.

Referring to FIG. 1, a block diagram of a supply system 110 used in an EUV light source 100 is shown. The supply system 110 emits a stream of targets 121 such that a target 121$p$ is delivered to a plasma formation location 123 in a vacuum chamber 109. In operational use, the supply system 110 is fluidly coupled to a reservoir 112 that contains target material under pressure P. The target material is any material that emits EUV light when in a plasma state. For example, the target material may include water, tin, lithium, and/or xenon. The target material may be in a molten state that is capable of flowing in, for example, a channel. The targets in the stream of targets may be considered to be droplets of target material or targets.

The supply system 110 includes a target formation apparatus 116. In the example of FIG. 1, the target formation apparatus 116 is accommodated in a housing 114. The target formation apparatus 116 includes a nozzle structure 118, which defines an orifice 119. The orifice 119 is fluidly coupled to the reservoir 112. For example, the orifice 119 may be fluidly coupled to the reservoir 112 via a channel (not shown in FIG. 1). The pressure in the vacuum chamber 109 is much lower than the pressure P applied to the reservoir, and the target material flows through the orifice 119. Target material emitted from the orifice 119 forms the stream of targets 121. The plasma formation location 123 receives a light beam 106. The light beam 106 is generated by an optical source 105 and delivered to the vacuum chamber 109 via an optical path 107. An interaction between the light beam 106 and the target material in the target 121$p$ produces a plasma 196 that emits EUV light.

The target formation apparatus 116 may include a microelectromechanical (MEMS) system 117 that is fabricated in a semiconductor device fabrication technology. In these implementations, the nozzle structure 118 and the orifice 119 are formed as part of the MEMS system 117, and the target formation apparatus 116, which includes the MEMS system 117, may be considered to be a MEMS-based target formation apparatus 116. The MEMS-based target formation apparatus 116 may be used in the supply system 110 instead of a target formation apparatus fabricated using traditional machining techniques.

The MEMS system 117 is fabricated in a semiconductor device fabrication technology instead of in a traditional machining technology. For example, the MEMS system 117 may be fabricated using wet etching and/or dry etching, electro discharge machining (EDM), and any other technology that is capable of manufacturing small devices. Traditional machining may use techniques that are different from those used to fabricate the MEMS system 117. Traditional machining techniques include, for example, sawing, milling, drilling, laser machining, and/or turning. A target formation apparatus may be fabricated by applying traditional machining techniques applied to high-strength metal (such as molybdenum, tungsten, or titanium) to form features (such as orifices, channels, and/or chambers). However, applying traditional machining to the high-strength metal may introduce rough surfaces, particles, and/or chemical contamination. These effects may be mitigated through surface treatments such as etching, cleaning, and/or polishing, but particle and/or chemical contamination that is not mitigated may affect the performance of a target formation apparatus made with traditional machining techniques.

For example, traditional machining may produce particles with extents that are larger than the diameter of an orifice through which target material passes. If not removed by cleaning, these particles may block the flow of target material. When target material does not flow from the orifice, target material does not arrive at the plasma formation location 123 and no EUV light is produced. Moreover, the blockage may result in damage to the target formation apparatus. Traditional machining also may produce particles with extents that are smaller than the diameter of the orifice. These particles may become lodged in the nozzle or the orifice and may partially block the orifice. When the orifice 119 is partially blocked, the target material emitted by the orifice 119 may be launched on a trajectory deviating from an expected path and may not reach the plasma formation location 123, leading to reduced or no EUV production. Chemically formed contamination also may block or partially obstruct the orifice.

However, because the target formation apparatus 116 includes the MEMS system 117, the target formation apparatus 116 may have improved performance and reliability with less stringent cleaning as compared to a target formation apparatus formed solely with traditional machining techniques. For example, the MEMS system 117 is fabricated using a semiconductor device fabrication technology, thus, the MEMS system 117 may be manufactured and assembled under clean room conditions and at a single location. The MEMS system 117 may be fabricated in a semiconductor device fabrication technology that is based on lithographic patterning and different etching processes, such as wet etching, reactive ion etching, focused ion beam etching and the like, and chemical reactions such as chemical vapor deposition. The chemical vapor deposition techniques include, for example, atmospheric pressure chemical vapor deposition (APCVD), atomic layer chemical vapor deposition (ACVD or ALCVD), hot filament chemical vapor deposition (HFCVP), low-pressure chemical vapor deposition (LPCVD), metal organic chemical vapor deposition (MOCVD), microwave plasma-assisted chemical vapor deposition (MPCVD), plasma enhanced chemical vapor deposition (PECVD), rapid thermal chemical vapor deposition (RTCVD), remote plasma enhanced chemical vapor deposition (RPECVD), ultra high vacuum chemical vapor deposition (UHVCVD). These various techniques are used to form thin layers of silicon oxide, silicon nitride, silicon carbide, and/or metals, such as, for example, gold, tungsten, chromium, and the like. As no abrasive manufacturing steps are involved, the MEMS system 117 results in the target formation apparatus 116 having less particle and/or chemical contamination than an apparatus fabricated using traditional machining techniques.

Furthermore, by using the MEMS technology portfolio to form the MEMS system 117, the target formation apparatus 116 may be easier to reproduce in large numbers with tight tolerances than an apparatus made using traditional machining techniques. For example, some target formation apparatuses include a capillary tube that is formed manually from quartz or a similar material. The capillary tube includes a nozzle that defines a small orifice formed through a complex manual process that may be challenging to reproduce reliably and challenging to keep free of particle and chemical contamination. Further, the materials used for the capillary tube may be prone to cracking, which may present challenges to using a traditionally formed capillary tube at pressures of up to 8,000 pounds per square inch (psi). The target formation apparatus 116 that includes the MEMS system 117 may operate without a capillary tube. Moreover, the materials that may be used for the MEMS system 117 are suitable for use with the target material and at pressures up to and exceeding 8,000 psi. In some implementations, the MEMS system 117 is made out of silicon (Si) with nitride coatings. Other materials that the MEMS system 117 may be made out of include silicon carbide (SiC), silicon nitride (SiN), and/or silicon dioxide ($SiO_2$). Moreover, any material used in the MEMS system 117 may be coated with nitride. For example, the MEMS system 117 may be made out of SiC coated with nitride, SiN coated with nitride, and/or $SiO_2$ coated with nitride.

Using the MEMS system 117 in the target formation apparatus 116 may provide additional advantages. For example, filters may be integrated into the MEMS system 117. The filters may be used to reduce particle contamination introduced between the target formation apparatus 116 and the reservoir 112. In some implementations, the filters may be placed at the beginning and end (considered with respect to the direction of flow from the reservoir 112 to the orifice 119) of the MEMS system 117 such that the MEMS system 117 is substantially closed to the outside environment.

Furthermore, components made in MEMS technology may be much smaller than similar components made in traditional machining techniques such as those noted above. For example, components made in MEMS technology may be an order of magnitude smaller than a similar component made in a traditional machining technique. Therefore, the MEMS system 117 itself may be made much smaller than similar components made in traditional machining techniques, and a target formation apparatus 116 that includes the MEMS system 117 may thus be smaller than a target formation apparatus that does not include the MEMS system 117. The smaller footprint of the target formation apparatus 116 may be advantageous as the overall amount of space available in the supply system 110 may be limited or restricted.

Figure 5A:
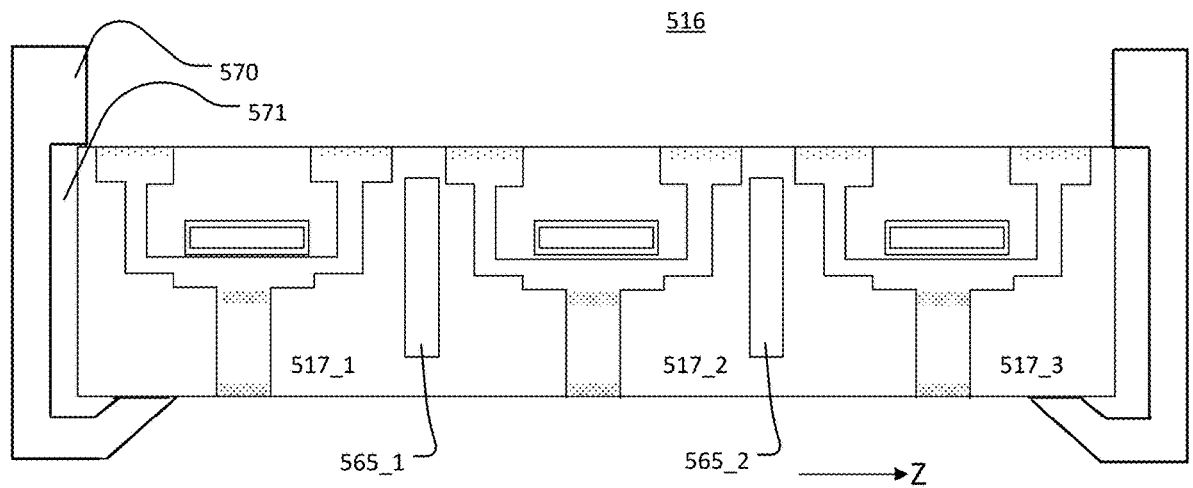
FIG. 5A is a block diagram of a side cross-sectional view of an example of a target formation apparatus that may be used with the supply system of FIG. 4.
Figure 5B:
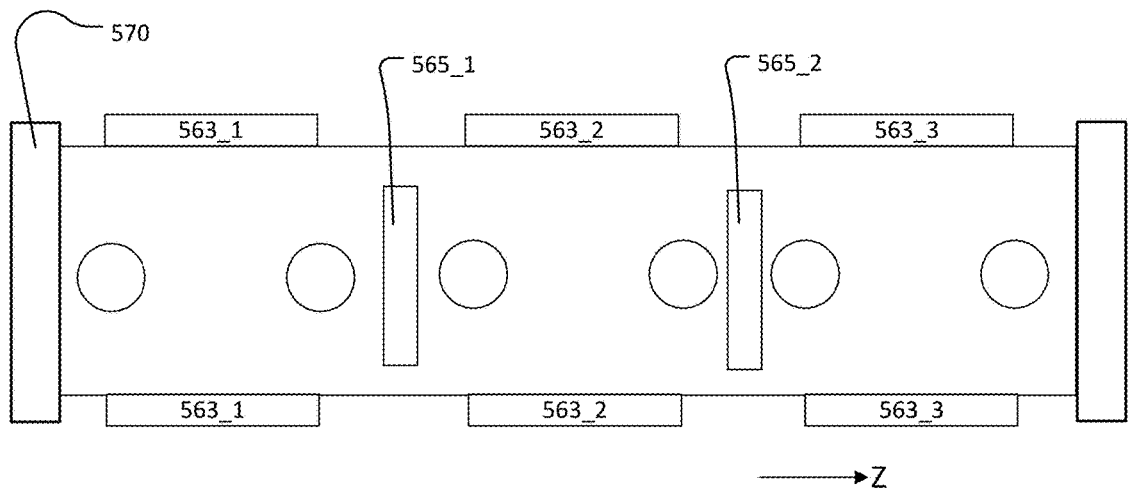
FIG. 5B is a top view of the target formation apparatus of FIG. 5A.

Moreover, including the MEMS system 117 in the target formation apparatus 116 may allow the target formation apparatus 116 to be fabricated as a monolithic structure that includes more than two individually controllable target formation apparatuses, each target formation apparatus including a respective MEMS system. FIGS. 5A and 5B show an example of this implementation. The target formation apparatuses within the monolithic structure are individually controllable such that any of the target formation apparatuses may be activated to produce the stream of targets 121 or deactivated to not produce the stream of targets 121. Thus, if any of the target formation apparatuses fail, have degraded performance, are nearing the end of their expected life time, or are desired to be switched out of service for any other reason, another of the target formation apparatuses may be activated such that EUV light continues to be produced.

Figure 6:
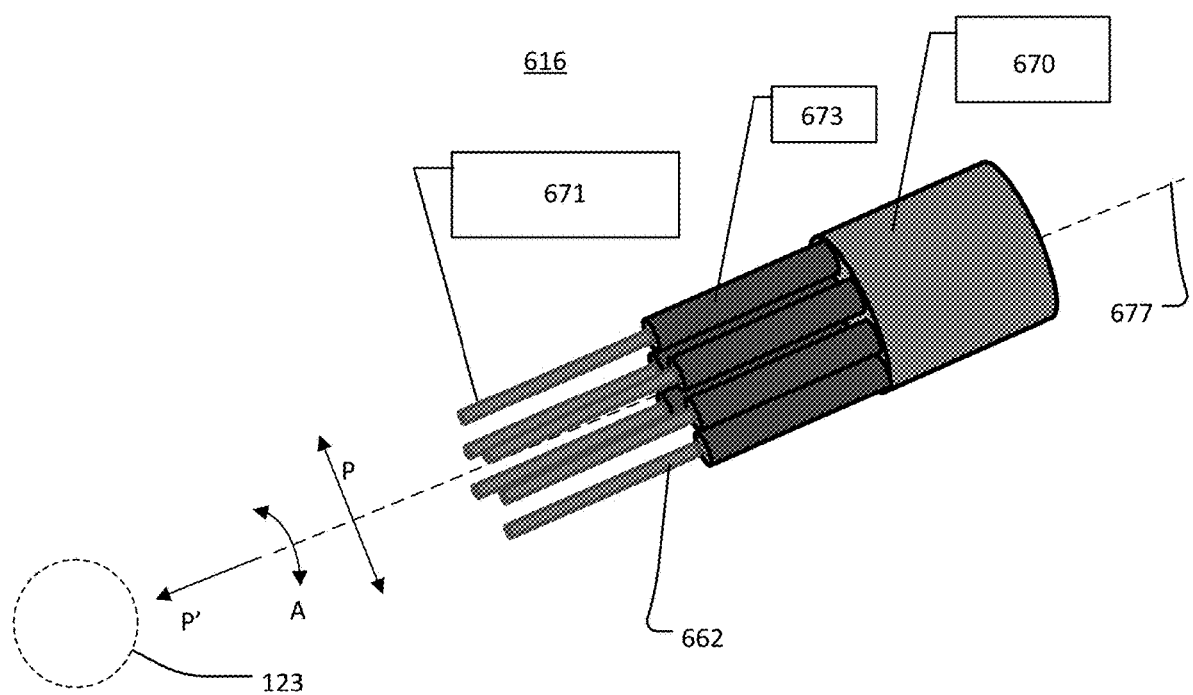
FIGS. 6-8 are perspective views of other examples of target formation apparatuses that may be used with the supply system of FIG. 4.

Although the MEMS system 117 is well suited for use in forming a monolithic structure that includes more than two target formation apparatuses, a group of target formation apparatuses, each fabricated using traditional machining techniques, also may be individually controlled and used together in a similar manner. FIG. 6 shows an example of such an implementation.

Figure 2A:
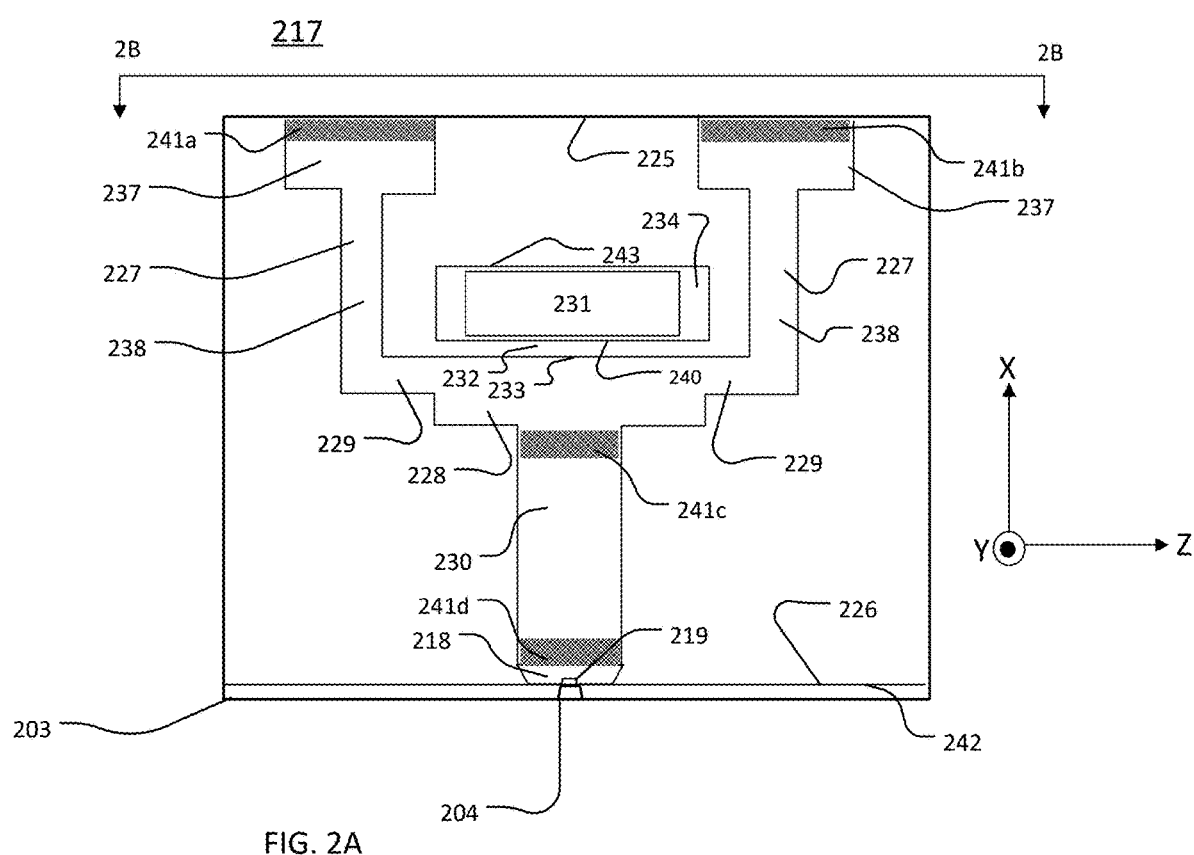
FIG. 2A is a block diagram of a side cross-sectional view of an example of a MEMS system that may be used with the supply system of FIG. 1.
Figure 2B:
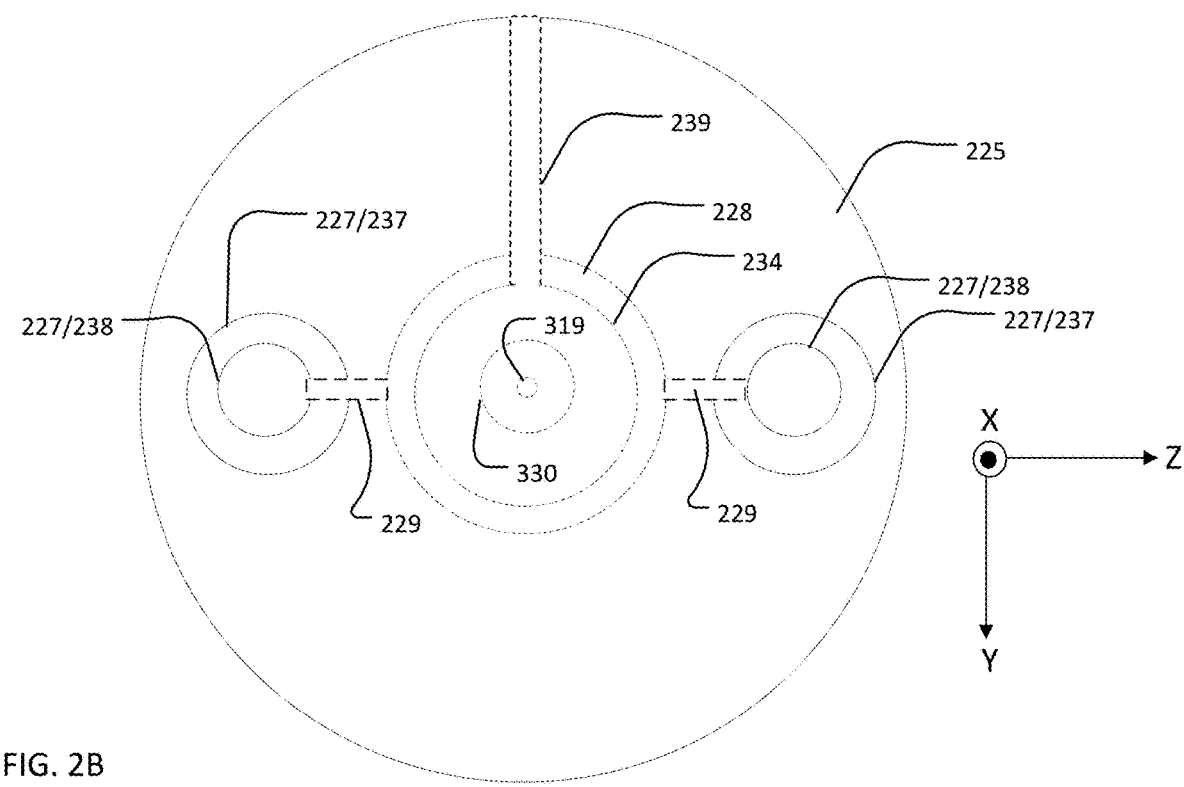
FIG. 2B is a block diagram of a top view of the MEMS system of FIG. 2A as seen from the line 2B-2B.

FIGS. 2A and 2B show a MEMS system 217 fabricated in a semiconductor device fabrication technology. The MEMS system 217 is an example of an implementation of the MEMS system 117 (FIG. 1). The MEMS system 217 may be used in the target formation apparatus 116 and the supply system 110 (FIG. 1), and the MEMS system 217 is discussed with reference to the supply system 110. FIG. 2A is a block diagram of a side cross-sectional view of the MEMS system 217. FIG. 2B is a block diagram of a top view of the MEMS system 217 as seen from the line 2B-2B. The dotted lines in FIG. 2B represent hidden elements that are below a first end 225 of the MEMS system 217.

The MEMS system 217 includes the first end 225 and a second end 226. In the MEMS system 217, the first end 225 and the second end 226 are at opposing sides. First channels 227 extend from the first end 225 along the X axis. In operational use, the first end 225 is oriented to face the reservoir 112, and target material from the reservoir 112 flows into the first channels 227. Each first channel 227 is fluidly coupled to a chamber 228 via a respective intermediate channel 229. The chamber 228 is, for example, a disk-shaped volume that is partially formed by a wall 233. The chamber 228 may have a shape other than a disk. For example, the chamber 228 may be a square-shaped or a rectangular-shaped volume. The chamber 228 is fluidly coupled to a second channel 230. The second channel 230 is fluidly coupled to a nozzle structure 218, which defines an orifice 219.

In the example of the MEMS system 217, the first channels 227 have mirror symmetry in the X-Z plane. In other implementations, the first channels 227 do not have mirror symmetry in the X-Z plane. For example, the MEMS system 217 may be implemented with three first channels 227 spaced 120° from each other in the Y-Z plane. In the MEMS system 217, the diameter of each of the first channels 227 in the Z-Y plane varies depending on the position along the X axis. Specifically, in the MEMS system 217, the diameter of the first channels 227 is greater in a portion 237 at the first end 225 than in a portion 238 at the intermediate channel 229. The change in diameter of the first channel 227 forms an acoustic filter that helps to filter acoustic disturbances arising from regions upstream of the first channel 227 (for example, in the reservoir 112).

When the MEMS system 217 is fluidly coupled to the (pressurized) reservoir 112, target material flows from the reservoir 112 into the first channels 227 and the intermediate channels 229. The target material flows from the intermediate channels 229 into the chamber 228, and from the chamber 228 into the second channel 230. The target material is emitted from the orifice 219 as a jet of target material that breaks into targets. Collectively, the first channels 227, the intermediate channels 229, the chamber 228, the second channel 230, and the orifice 219 form a target material path from the first end 225 to the second end 226.

The MEMS system 217 also includes filters 241a-241d. In the example of FIGS. 2A and 2B, the MEMS system 217 includes four filters, with filters 241a, 241b in a first channel 227 at the first end 225, the filter 241c in the second channel 230 between the chamber 228 and the second channel 230, and the filter 241d in the nozzle structure 218 near the orifice 219. The filter 241d is placed in the X direction relative to the orifice 219. Thus, in operational use, the target material flows through the filters 241a, 241b at the first end 225 prior to flowing into the first channels 227, through the filter 241c to enter the second channel 230, and through the filter 241d before passing through the orifice 219.

The filters 241a-241d may be, for example, any type of filter that is fabricated in a semiconductor device fabrication technology. The filters 241a-241d may include arrays of filter channels or openings that allow target material to pass and a filtration surface that captures particles that are larger than the diameter of the filter channels. For example, the filter channels may have diameters that are smaller than the diameter of particles that could block or partially block the orifice 219. The particles are captured on the filtration surface, and the filters 241a-241d filter the target material by retaining particulate debris such that the debris is prevented from being transported toward the orifice 219.

Figure 2C:
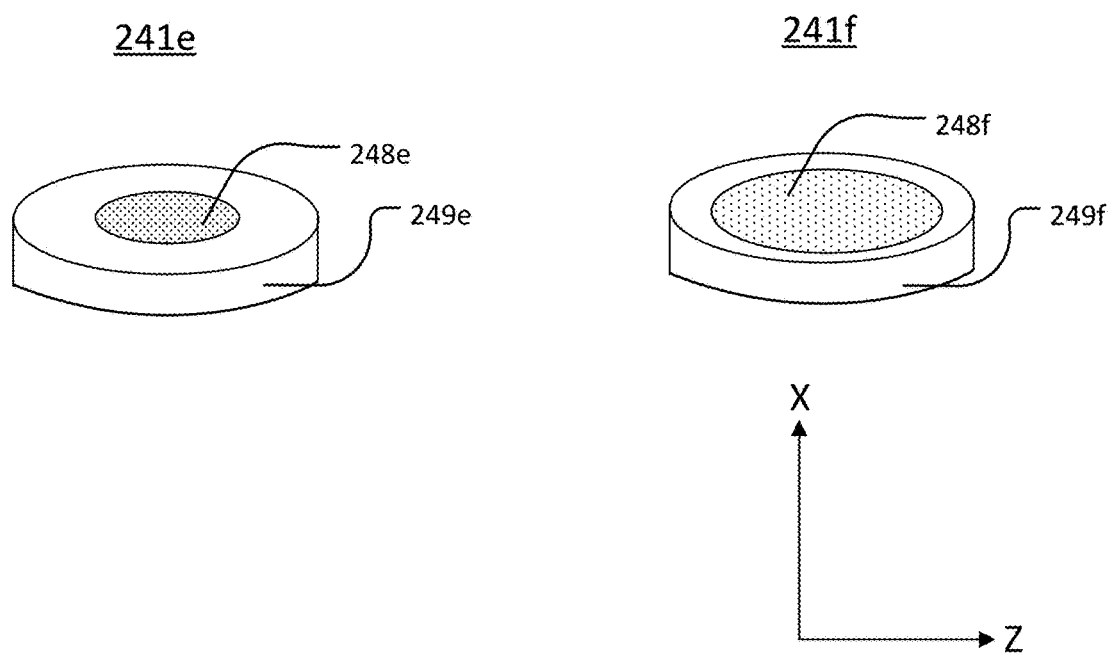
FIG. 2C shows perspective views of filters that may be used in the MEMS system of FIGS. 2A and 2B.

FIG. 2C is a perspective view of a filter 241e and a filter 241f. Either of the filters 241e, 241f may be used as any of the filters 241a-241d. The filters 241e, 241f include respective filtration surfaces 248e, 248f and supports 249e, 249f. In the filtration surfaces 248e, 248f, the dots represent filter channels or openings through which target material may flow. The channels or openings may pass entirely through the filter 241e, 241f along the X axis.

The filter channels may have a diameter of, for example, 1-20 μm. The filter channels may have a diameter that is smaller than the diameter of the orifice 219. For example, the orifice 219 may have a diameter of 2-5 μm, and the filter channels may have a diameter of 1-2 μm or less. The filters 241a-241d may have the same characteristics, or the filters 241a-241d may be different from each other. For example, the filter 241d may have channels that have a smaller diameter than the channels of the filters 241a, 241b, or 241c. In some implementations, the filters 241a and 241b may have channels that have a diameter that is larger than the diameter of the orifice 219 to block larger particles, the filter 241c may have channels that have a diameter that is the same as the diameter of the orifice 219, and the filter 241d may have channels that have a diameter that is smaller than the diameter of the orifice 219.

The filters 241a-241d may be membrane filters that include a membrane that forms a filtration region held in place by supports. In some implementations, one or more of the filters 241a-241d are high-porosity microsieve filters. The filters may be manufactured to have a burst pressure of greater than 100 bars (or greater than about 1450 psi). The filters 241a-241d also may be acoustically transparent.

Referring again to FIGS. 2A and 2B, the MEMS system 217 also includes an actuator 231 in a space 234. The actuator 231 is coupled to the chamber 228 and is configured to modulate a pressure in the chamber 228. In the MEMS system 217, the actuator 231 is mechanically coupled to the chamber 228 through a membrane 232. The membrane 232 is mechanically coupled to the actuator 231 such that the modulation of the actuator 231 is transferred to the chamber 228. For example, the modulation of the position of the membrane 232 may produce a corresponding change in the pressure in the chamber 228. The membrane 232 separates the actuator 231 from the chamber 228. Thus, the membrane 232 also may help to protect the actuator 231 from target material in the chamber 228. In the MEMS system 217, part of the membrane 232 is formed from the wall 233.

The space 234 is bounded by walls, two of which (walls 240 and 243) are labeled in FIG. 2A. The walls 240 and 243 are separated along the X axis and are at opposite sides of the space 234. In some implementations, the actuator 231 is clamped between the walls 240 and 243. In these implementations, the actuator 231 may be configured to expand and contract along the X axis to cause the membrane 232 to move. In another implementation, the actuator 231 is rigidly attached to the wall 240 and the membrane 232 by, for example, gluing, soldering, or brazing. In these implementations, the actuator 231 may be configured to bend against the wall 240 to cause the membrane 232 to move.

The actuator 231 may be any suitable actuation mechanism that is able to modulate the pressure in the chamber 228 by modulating the position of the membrane 232. For example, the actuator 231 may be a piezo actuator, which includes a piezo material that exhibits the inverse piezoelectric effect such that the piezo material elongates, bends, contracts, expands, and/or otherwise changes shape when an electric field is applied. In implementations in which the actuator 231 is a piezo actuator, the actuator 231 may include lead-zirconium-titanate (PZT) or another similar material. In these implementations, the actuator 231 may be a single piezo actuator (for example, a single piezo-platelet or a single layer of material that exhibits the inverse piezoelectric effect), two piezo actuators, or a multi-layer piezo assembly. In some implementations, the actuator 231 is formed from a single layer of piezo material deposited directly onto a wall or side 240 of the membrane 232 that faces the space 234.

In implementations in which the actuator 231 is a piezo actuator that includes a piezo material, the piezo material may have any shape. For example, the shape of the piezo material may be, for example, a disk, a square, a rectangle, a cylinder, a tube, or an annulus. In implementations in which the actuator 231 is a piezo actuator, the configuration of the piezo material may be selected based on how the piezo actuator is mounted in the space 234. As discussed above, the actuator 231 may be clamped between the walls 240 and 243. In these implementations, a piezo actuator that is configured to change shape (for example, elongate) along the X axis in response to the application of an electric field may be used. In implementations in which the actuator 231 is attached to the wall 240 and not to the wall 243, a piezo actuator that bends in response to the application of an electric field may be used.

Electrodes (not shown) may be placed near the piezo material to apply an electric field across the piezo material, and the modulation of the electric field causes the mechanical modulation of the piezo material. The electric field generated by the electrodes may be controlled to apply an electric field across the piezo material using signal control lines or a similar mechanism that reaches the electrodes through a conduit 239 (FIG. 2B). The conduit 239 passes through the MEMS system 217 along the Y axis. The conduit 239 provides access to the space 234 from an exterior of the MEMS system 217.

The conduit 239 (or another conduit similar to the conduit 239) may be used to control the pressure in the space 234 such that the pressure in the space 234 (at the actuator 231) and the pressure in the chamber 228 are substantially the same. In this way, the only pressure difference experienced by the membrane 232 is the pressure difference that arises from the actuator 231 modulating the membrane 232.

Applying the pressure P (FIG. 1) to the target material in the reservoir 112 causes the target material to exit the orifice 219 as a jet of target material. The jet of target material eventually breaks into targets. The natural break-up of a jet of liquid issuing from an orifice is known as the Rayleigh break-up. The Rayleigh frequency is the rate of production of individual droplets through Rayleigh break-up. The Rayleigh frequency is related to the average (or mean) velocity of the target material at the orifice 219 and the diameter of the orifice 219. The Rayleigh break-up may occur without modulating the pressure in the chamber 228. However, modulating the pressure in the chamber 228 allows more control over the break-up of the jet of target material. For example, modulating the pressure of the chamber 228 at a frequency that is much lower than the Rayleigh frequency also modulates the exit velocity of the target material from the orifice, thus allowing the break-up of the stream to occur in a more controlled manner.

As discussed above, the actuator 231 is used to modulate the pressure in the chamber 228. In one implementation, a low-frequency modulated continuous jet technique may be applied to the actuator 231 to form the stream of targets 121. In the low-frequency modulated continuous jet technique, the actuator 231 is controlled with an input signal that has at least two frequencies. The at least two frequencies include a first frequency and a second frequency. The first frequency may be in the megahertz (MHz) range. The first frequency may be close to the Rayleigh frequency. Modulating the pressure in the chamber 228 at the first frequency causes the jet of target material to break into relatively small targets of desired sizes and speeds.

The second frequency is lower than the first frequency. For example, the second frequency may be in the kilohertz (kHz) range. The second frequency is used to modulate the velocity of the targets in the stream and to determine the rate of target production. Modulating the pressure in the chamber 228 at a frequency that is much lower than the Rayleigh frequency causes groups of targets to form. In any given group of targets, the various targets travel at different velocities. The targets with higher velocities may coalesce with the targets with lower velocities to form larger coalesced targets that make up the stream of targets 121. These larger targets are separated from each other by a larger distance than the non-coalesced droplets. The larger separation helps to mitigate the influence of the plasma formed from one target on the trajectory of the subsequent targets in the stream 121.

The targets in the stream of targets 121 may be approximately spherical, with a diameter of about 30 μm. The targets may be generated at frequencies of, for example, between 40 to 310 kHz and may travel toward the plasma formation location 123 (FIG. 1) at a velocity of, for example, between 40 and 120 meters per second (m/s) or up to 500 m/s. The spatial separation between two adjacent targets in the stream of targets 121 may be, for example, between 1 and 3 millimeters (mm). Between 100 and 300 initial droplets (also called Rayleigh droplets) may coalesce to form a single larger target.

As discussed above, the actuator 231 may be driven by at least two frequencies, one that is close to the Rayleigh frequency and another frequency (a second frequency) that encourages coalescence. The second frequency that encourages coalescence determines the frequency at which targets arrive in the plasma formation location 123.

The mechanical structure of the MEMS system 217 may be used to determine the second frequency. For example, a resonant frequency of the MEMS system 217 may be used as the second frequency. The Helmholtz frequency or a frequency determined by the length of the second channel 230 along the X axis may be used as the second frequency, depending on the geometry of the MEMS system.

The Helmholtz frequency ($f_{Helmholtz}$) is shown in Equation (1):

$$f_{Helmholtz} = \frac{c}{2\pi}\sqrt{\frac{1}{V_c}\left(\frac{A_{orifice}}{L_{orifice}} + n\frac{A_{throttle}}{L_{throttle}}\right)}, \quad \text{Equation (1)}$$

where c is the speed of sound in the (flowing) target material corrected for the compliance of the surroundings of the material, $V_c$ is the volume of the chamber 228, $A_{orifice}$ is the surface area of the orifice 219, $L_{orifice}$ is the length of the orifice 219, $A_{throttle}$ is the surface area of one of the intermediate channels 229, $L_{throttle}$ is the length of one of the intermediate channels, and n is the number of intermediate channels 229. For implementations that include the channel 230 (such as the implementation of FIG. 2A), the second frequency may change based on the design parameters or geometry of the channel 230.

The quarter-wavelength frequency, which is the frequency at which a quarter of a wave with that frequency fills the second channel 230 and the nozzle structure 218 along the X axis, may be used as the second frequency. Excluding acoustic corrections, the quarter-wavelength frequency ($f_{qw}$) is shown in Equation (2):

$$f_{qw} = \frac{c}{4L}, \quad \text{Equation (2)}$$

where c is the speed of sound in the (flowing) target material corrected for the compliance of the surroundings of the material, and L is the total length along the X axis of the second channel 230 and the nozzle structure 218. For the MEMS system 217, the quarter-wavelength frequency may be used as the second frequency. For example, assuming that c is 2000 m/s, to generate targets at a frequency of 320 kHz, L is 1.5 mm.

Figure 3A:
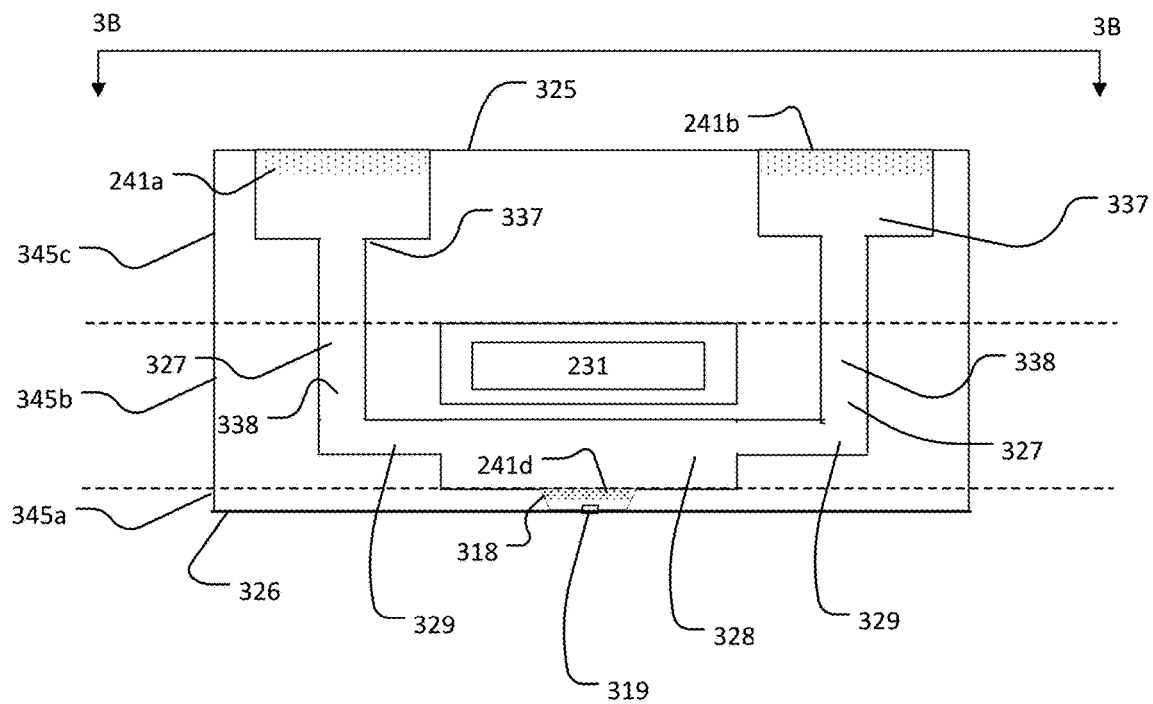
FIG. 3A is a block diagram of a side cross-sectional view of another example of a MEMS system that may be used with the supply system of FIG. 1.

The MEMS system 217 may be designed without the second channel 230 such that the orifice 219 is directly coupled to the chamber 228 or with a second channel 230 that has a negligible extent between the orifice and the chamber 228. In these implementations, the second frequency is defined by the Helmholtz frequency (Equation 1). FIGS. 3A and 3B show an example of such an implementation.

In implementations in which the second frequency is determined by the extent of the second channel 230 (such as, for example, from Equation 2), the thickness of the layer that contains the second channel 230 may be controlled to within tight tolerances to control the extent of the second channel 230. In this way, such an implementation provides a tightly controlled value for the second frequency. For example, in some implementations, the MEMS system 217 is implemented as a planar (or substantially flat) structure with as few layers as possible.

Other techniques may be used to modulate the pressure in the chamber 228. For example, in some implementations, the coalescence may be enhanced by adding harmonic frequencies between the first and second frequencies. Additionally or alternatively, a technique based on amplitude modulation may be used. Moreover, although the example above discusses using the quarter-wavelength frequency as the second frequency, other frequencies may be used. For example, a frequency greater than or equal to the frequency at which three quarters of a wave with that frequency fills the second channel 230 and the nozzle structure 218 along the X axis, may be used as the second frequency.

An electrically conductive coating 242 may be formed on the second end 226. The conductive coating 242 may be any electrically conductive material. The nozzle structure 218, orifice 219, and other portions of the MEMS system 217 may be made from an insulating material such as silicon nitride (SiN). Electrical charge may accumulate on the second end 226 and other portions of the MEMS system 217 as a result of friction between the target material and the walls of the nozzle structure 218, of the first channels 227, of the second channel 230 and of other portions of the MEMS system 217. The presence of this charge may impede formation of the coalesced targets and/or change the path of the targets due to a Coulomb repulsion between the targets. To mitigate this, the conductive coating may be grounded to remove the accumulated charge. The conductive coating 242 may be any electrically conductive material that is resistant to being corroded or otherwise degraded by exposure to the target material (for example, molten tin). For example, the conductive coating may be silicon dioxide, silicon monoxide, molybdenum, tungsten, tantalum, iridium, or chromium.

Figure 2D:
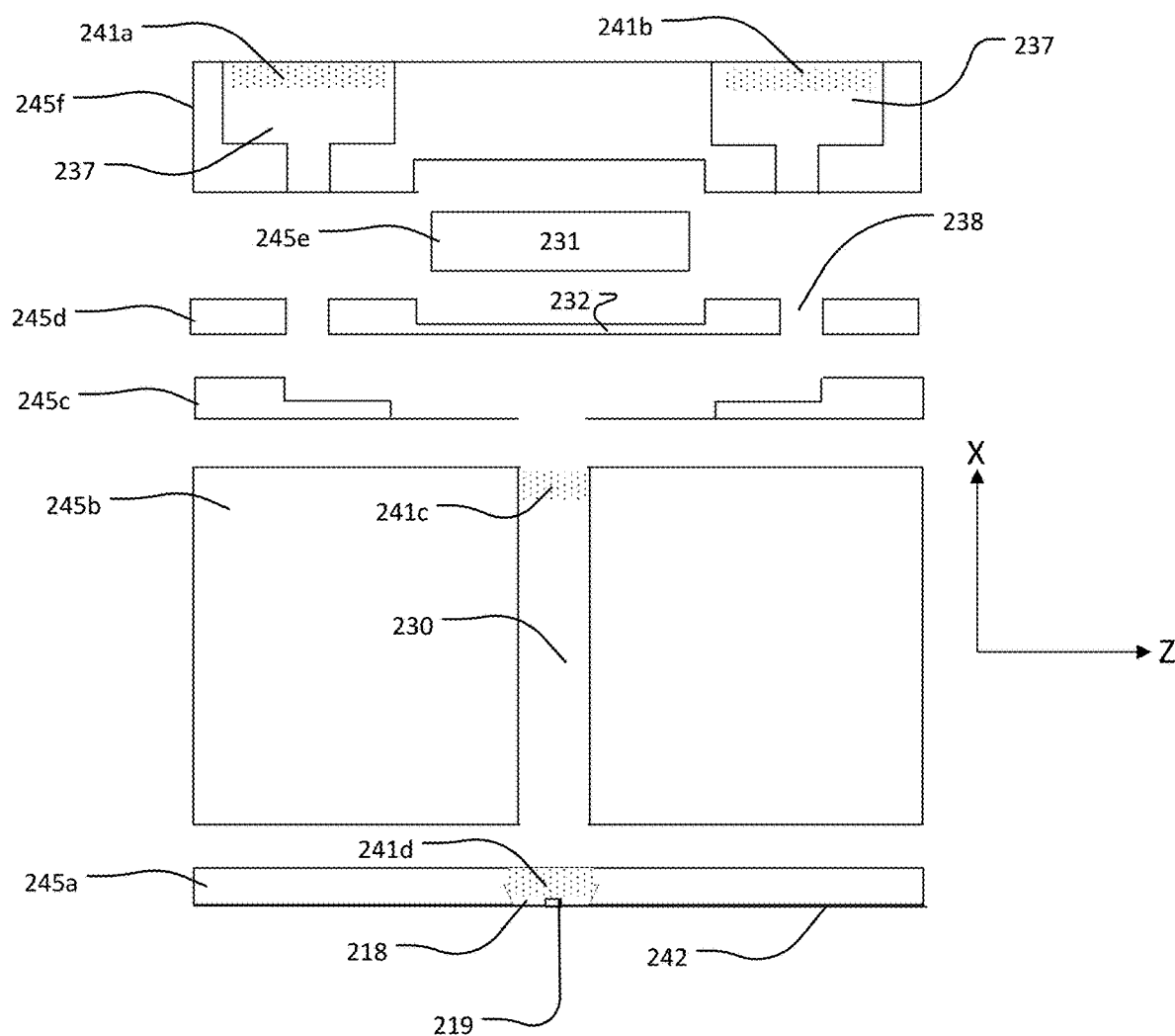
FIG. 2D is a block diagram of the MEMS system of FIGS. 2A and 2B in an unassembled state.

The MEMS system 217 is used in the assembled state. FIGS. 2A and 2B show the MEMS system 217 in the assembled state. Referring to FIG. 2D, a block diagram of the MEMS system 217 in an unassembled state is shown. The MEMS system 217 includes layers 245a-245f. In the assembled state, the layers 245a-245f are joined to each other along the X axis. In the assembled state, the MEMS system 217 may be considered to be a monolithic part formed from more than one layer. The monolithic part that forms the MEMS system 217 is a single, integral piece or part.

In the example of FIG. 2D, the nozzle structure 218, the orifice 219, and the filter 241d are formed as part of the layer 245a. The layer 245a also may include the electrically conductive coating 242. The nozzle structure 218 may have a coating of, for example SiN. The second channel 230 is formed as part of the layer 245b. The chamber 228 and the intermediate channel 229 are formed in the layer 245c. The membrane 232 and the portion 238 of the first channel 227 are formed in layer 245d. The actuator 231 and associated components (for example, electrodes) are formed in layer 245e. The portion 237 of the first channel 227, and the filters 241a, 241b are formed in layer 245f.

Other arrangements are possible. For example, the features of the layers 245b and 245c may be fabricated as a single layer, thus reducing the total number of layers in the MEMS system 217 to five. In another example, the features of layers 245c, 245d, and 245e (which form, for example, the chamber 228 and the membrane 232) may be fabricated as a single layer, thus reducing the total number of layers in the MEMS system 217 to four.

The layers 245a-245f may be permanently joined through, for example, a thermal, chemical, and/or mechanical bond such that, after being assembled, the layers 245a-245f are not separable from each other without causing damage. In other implementations, the layers 245a-245f are joined temporarily while the MEMS system 217 is used in the assembled state. In these implementations, the layers 245a-245f may be separated from each other after being assembled without causing damage. Techniques for temporarily joining the layers 245a-245f include, for example, applying a force to the layers 245a-245f along the X axis (in the X and/or −X directions) with a clamp or mechanical mount. In some implementations, the layers 245a-245f may be permanently joined and held in a clamp.

Figure 8:
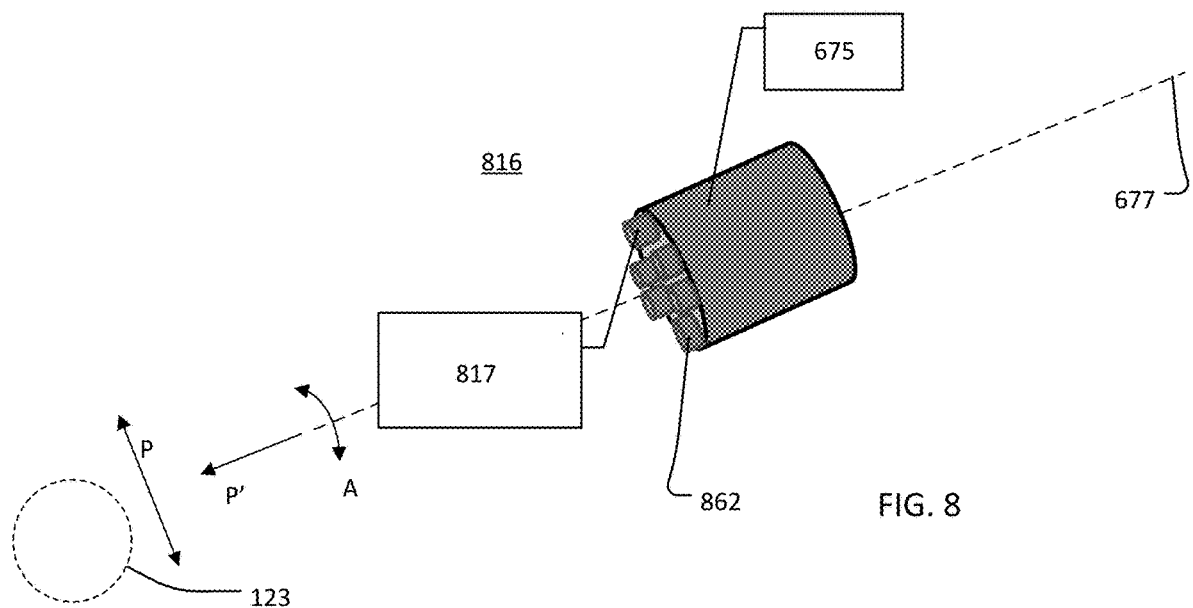

The layers 245a-245f may be fabricated separately. Thus, a different semiconductor device fabrication technology may be used for each of the layers 245a-245f. Additionally, the features of the MEMS system 217 that perform different functions may be fabricated in separate layers. For example, the actuator 231 and the nozzle structure 218 are fabricated as different layers. The orifice 219 may be formed on a surface or an edge of a silicon wafer by etching. In some implementations, more than one orifice 219 is etched onto a silicon wafer to form a group of target formation units. An example of this implementation is shown in FIG. 8.

Because each of the layers 245a-245f is fabricated using a semiconductor device fabrication technology, the layers 245a-245f are manufactured with a much greater degree of cleanliness than is possible using traditional machining technique. Additionally, in the example of the MEMS system 217, the filters 241a and 241b also close the entrance to the MEMS system 217 in the assembled state. Closing the entrance may further enhance cleanliness of the MEMS system 217, for example, contamination of the interior portion of the MEMS system 217 is limited by the filters 241a and 241b during assembly and during operational use.

Any type of semiconductor device fabrication technology may be used to form the layers 245a-245f. For example, each of the layers 245a-245f may be formed from a silicon wafer. After the layers 245a-245f are formed, the layers may be joined by bonding each layer to an adjacent layer or layers. After the layers 245a-245f are bonded, coatings are applied (for example, oxide and/or nitride coatings may be applied to each layer). In some implementations, each of the layers 245a-245f are formed and a coating is applied to each of the layers 245a-245f before the layers 245a-245f are joined. As is known, bonding strengths depend on the surface roughness of the bonded surfaces.

Thus, the MEMS system 217 is expected to be operational even when placed under a relatively high pressure (for example, 8,000 psi). Moreover, in some implementations, the target formation apparatus 116 is operated and/or designed in an iso-static manner. In these implementations, the actuator 231 and/or other parts of the MEMS system 217, or the entire MEMS system 217 is at the same pressure as the pressure of the target material in the chamber 228 or at a partial (or reduced) pressure compared to the pressure of the target material in the chamber 228.

In the implementation shown in FIG. 2A, the MEMS system 217 is placed in a mechanical support or mount 203. The mount 203 may include a device (such as, for example, a clamp) that applies additional force along the X direction and/or −X direction to aid in maintaining the structural integrity of the MEMS system 217 during operational use. In the example shown in FIG. 2A, the mount 203 surrounds the MEMS system 217. The mount 203 also includes an opening 204 that coincides with the orifice 219 such that target material may be emitted from the orifice when the MEMS system 217 is in the mount 203.

FIG. 3A is a block diagram of a side cross-sectional view of a MEMS system 317. FIG. 3B is a block diagram of a top view of the MEMS system 317 as seen from the line 3B-3B. The dotted lines in FIG. 3B represent hidden elements that are below a first end 325 of the MEMS system 317.

The MEMS system 317 is another example of an implementation of the MEMS system 117 (FIG. 1). The MEMS system 317 may be used in the supply system 110 (FIG. 1), and the MEMS system 317 is discussed with reference to the supply system 110. The MEMS system 317 is similar to the MEMS system 217, except the MEMS system 317 does not include a second channel such as the second channel 230.

The MEMS system 317 includes first channels 327, which extend along the X axis from an end 325. As shown in FIG. 3B, the MEMS system 317 includes six of the first channels 327 that are radially separated from each other by 60°. For simplicity, only one of the first channels 327 is labeled in FIG. 3B. Each of the first channels 327 is fluidly coupled to a chamber 328 via intermediate channels 329. The chamber 328 is fluidly coupled to a nozzle structure 318, which defines an orifice 319. As shown in FIG. 3A, the MEMS system 317 also includes filters 241a, 241b, and 241d and the actuator 231. Although not shown in FIG. 3B, each of the first channels 327 includes a filter similar to the filter 241a or the filter 241b positioned at the end 325.

When the MEMS system 317 is fluidly coupled to the pressurized reservoir 112, target material flows from the reservoir 112 through the filters at the first end 325 (for example, the filters 241a, 241b shown in FIG. 3A) and into the first channels 327. The target material flows from the intermediate channels 329 into the chamber 328, and from the chamber 328 into the filter 241d and then into the nozzle structure 318. The target material is emitted from the orifice 319 as a jet of target material that breaks into targets. Collectively, the first channels 327, the intermediate channels 329, the chamber 328, and the orifice 319 form a target material path from the first end 325 to a second end 326.

The actuator 231 is coupled to the chamber 328 in a manner similar to the actuator 231 in the MEMS system 217. In the MEMS system 317, the actuator 231 may be driven with two or more frequencies, including a frequency that is close the Rayleigh frequency. The second frequency may be the Helmholtz frequency, shown in Equation (1). As shown in Equation (1), the Helmholtz frequency depends on the number of intermediate channels 329 and on the surface area and length of the intermediate channels 329. Thus, the second frequency (and thus the frequency of target production) may be tuned by increasing the number of intermediate channels 329 and/or by modifying the geometry of the intermediate channels 329.

The MEMS system 317 is shown in the assembled state. The MEMS system 317 includes three layers 345a, 345b, and 345c. The boundary of the layers are shown in FIG. 3A with two dashed lines. The layers 345a, 345b, and 345c may be fabricated separately and are joined to form the assembled MEMS system 317. The assembled MEMS system 317 may be accommodated in a mount such as the mount 203 of FIG. 2A.

Figure 3A:
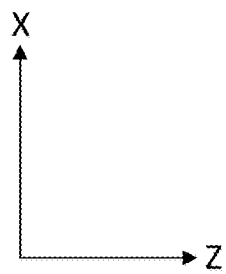

Other implementations of the MEMS system 117 are possible. For example, the MEMS systems 217 and 317 are configured such that the target material path is between two opposing sides of the MEMS system. However, other configurations may be used. For example, target material may enter the MEMS system along the Z axis and exit the MEMS system in the −X direction such that the target material path extends from ends of the MEMS system that are not at opposing sides. The MEMS system 217 includes six of the first channels 227, though other implementations may include more or fewer first channels. For example, in some configurations, a single channel may extend from the first end 225 to the chamber 228. The MEMS systems 217 and 317 may include more or fewer layers than the respective examples shown in FIGS. 2D and 3.

Furthermore, the first channels 227 include the portions 237 and 238, and the first channels 337 include the portions 337 and 338. The relative dimensions of the portion 237 to the portion 238, and the dimensions of the portion 337 to the portion 338 may be different in different implementations. For example, in some implementations of the MEMS system 317, the portion 337 may extend along the X axis for the entire length of the layer 345c such that the entire portion 338 is in the layer 345b. Similarly, in some implementations of the MEMS system 217, the portion 237 may extend along the X axis for the entire length of the layer 245f such that the portion 238 is in a separate layer.

FIGS. 12A, 12B, 13A, and 13B show additional example implementations of the MEMS system 117. Before discussing other example implementations of a MEMS system, FIGS. 4-8 are discussed. FIGS. 4-8 provide examples of a supply system that includes two or more controllable target formation units.

Figure 4:
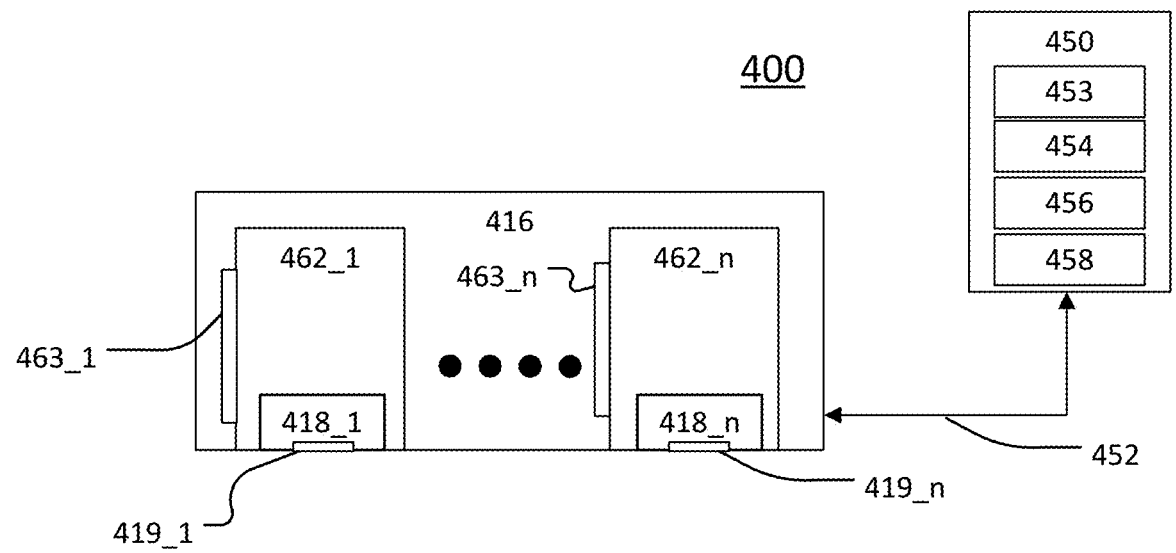
FIG. 4 is a block diagram of another example of a supply system for an EUV light source.

Referring to FIG. 4, a block diagram of a supply system 400 is shown. The supply system 400 may be used in an EUV light source. The supply system 400 includes a target formation apparatus 416 and a control system 450. The target formation apparatus 416 includes n target formation units 462 (labeled as 462l to 462n), where n is any integer number greater than or equal to two. Each of the target formation units 462 includes a nozzle structure 418, which defines an orifice 419. In FIG. 4, the nozzle structures 418 are labeled 418l to 418n, and the respective orifice 419 for each nozzle is labeled 419l to 419n.

The target formation units 462 may be MEMS-based. For example, each of the target formation units 462 may be an instance of the MEMS system 117 (FIG. 1). An example of such an implementation is shown in FIGS. 5A and 5B. In other implementations, the target formation units 462 are not MEMS-based and are instead made using traditional machining techniques. For example, each of the target formation units 462 may be formed from a high-strength metal that is machined using traditional machining techniques but with a nozzle that does not include a capillary tube. In some implementations, such as shown in FIG. 6, each of the target formation units 462 is made with traditional machining techniques and also includes a capillary tube.

The target formation apparatus 416 is configured to be fluidly coupled to a reservoir that contains target material, such as the reservoir 112 of FIG. 1. In operational use, the orifices 419 are fluidly coupled to the reservoir such that pressurized target material is able to flow from the reservoir to any of the orifices 419. Each of the target formation units 462 is capable of being activated or deactivation. The control system 450 controls which of the n target formation units 462 are able to produce targets at any given time by activating or deactivating certain one or more of the target formation units 462. A particular target formation unit 462 is activated when it is able to emit target material from the respective orifice 419. A particular target formation unit 462 is deactivated when target material is not able to be emitted from the respective orifice 419.

The control system 450 controls the deactivation and/or activation of the target formation units 462. In some implementations, including the implementation shown in FIG. 4, the control system 450 includes a temperature system 453 that is configured to control an amount of heat in the target formation units 462. As discussed above, the target material may be in a molten state that is able to flow. For example, the target material may include molten tin. In these implementations, the temperature system 453 may add or remove heat from the target formation apparatus 416 and/or particular ones of the target formation units 462. Adding heat may ensure that the target material remains in the molten state, whereas removing heat or cooling the target formation apparatus 416 and/or particular ones of the target formation units 462 causes the target material to solidify. When the target material is in the molten state, target material may be emitted from the orifice 419 and the target formation unit 462 is active. When the target material is solidified, target material is not emitted from the orifice and the target formation unit 462 is not active.

The temperature system 453 may include individual temperature systems 462l to 463n, with each of the target formation units 462l to 462n being associated with a respective one of the temperature systems 463l to 463n. Each of the temperature systems 463_1 to 463n may include one or more cooling devices and/or one or more heating devices. The cooling device is any device capable of lowering the temperature of the associated target formation unit. For example, the cooling device may be an element that absorbs heat. The heating device is any device capable of increasing the temperature of the associated target formation unit. For example, the heating device may be a heater or a collection of heaters. The heating device and/or the cooling device may be implemented using, for example, a Peltier device. A Peltier device is a solid-state active heat pump that transfers heat from one side of the device to the other. A Peltier device also may be referred to as a Peltier heat pump, a Peltier cooler, a Peltier heater, a thermoelectric heat pump, a solid state refrigerator, or a thermoelectric cooler (TEC).

The control system 450 may control the temperature systems 463l to 463n with activation and deactivation signals sent via the communications link 452. The communications link 452 may be any type of communication link capable of sending data and electronic signals.

The control system 450 exchanges data and/or information with the target formation apparatus 416 and/or any component of the target formation apparatus 416 via the communications link 452. The control system 450 also includes an electronic processor 454, an electronic storage 456, and an input/output (I/O) interface 458. The electronic processor 454 includes one or more processors suitable for the execution of a computer program such as a general or special purpose microprocessor, and any one or more processors of any kind of digital computer. Generally, an electronic processor receives instructions and data from a read-only memory, a random access memory, or both. The electronic processor 454 may be any type of electronic processor.

The electronic storage 456 may be volatile memory, such as RAM, or non-volatile memory. In some implementations, and the electronic storage 456 includes non-volatile and volatile portions or components. The electronic storage 456 may store data and information that is used in the operation of the control system 450 and/or components of the control system 450.

The electronic storage 456 also may store instructions, perhaps as a computer program, that, when executed, cause the electronic processor 454 to communicate with components in the control system 450, the target formation apparatus 416, and/or components in an EUV light source that includes the target formation apparatus 416.

The I/O interface 458 is any kind of electronic interface that allows the control system 450 to receive and/or provide data and signals with a human operator, the target formation apparatus 416, and/or an EUV light source that includes the target formation apparatus 416, and/or an automated process running on another electronic device. For example, the I/O interface 458 may include one or more of a visual display, a keyboard, and a communications interface. In some implementations, the I/O interface 458 may be configured to connect to and communicate with a remote computer via a network such as the Internet.

The control system 450 may communicate with the target formation apparatus 416 to select a particular one of the target formation units 462 for activation or deactivation in response to information received at the I/O interface 458. For example, the I/O interface 458 may receive an indication from an EUV light source that includes the target formation apparatus 416 that no EUV light is being produced. In another example, the control system 450 may receive an indication of an amount of EUV light that is being produced, and may compare the amount to an expected value stored in the electronic storage 456. The control system 450 may activate a different target formation unit in response to the indication of no EUV light production or an amount that is below the expected value. In another example, a human operator may interact with the I/O interface 458 to select a particular one of the target formation units 462*l* to 462*n* for activation or deactivation.

The control system 450 also may control other aspects of the target formation apparatus 416. For example, the control system 450 may be configured to cause the target formation apparatus 416 to move by activating a mechanical positioning stage or similar device upon which the target formation apparatus 416 is mounted. In some implementations, the control system 450 may control an actuator in the target formation unit, such as the actuator 231. For example, the control system 450 may be used to provide the first and second frequencies to electrodes that are near the actuator 231.

Referring to FIGS. 5A and 5B, a target formation apparatus 516 is shown. The target formation apparatus 516 is accommodated in a mount 570. FIG. 5A is a block diagram of a side cross-sectional view of the target formation apparatus 516 and the mount 570. FIG. 5B is a block diagram of a top view of the target formation apparatus 516 and the mount 570. The target formation apparatus 516 is an example of an implementation of the target formation apparatus 416 (FIG. 4), and the target formation apparatus 516 may be used with the control system 450.

The target formation apparatus 516 is an example of a MEMS-based supply system with individually controllable MEMS-based target formation units 517_1, 517_2, and 517_3. The target formation apparatus 516 includes three instances of the MEMS system 217, which is discussed above with respect to FIGS. 2A-2D. The target formation apparatus 516 is a monolithic part formed from joined layers. The three instances are the target formation units 517_1, 517_2, and 517_3. Each of the target formation units 517_1, 517_2, and 517_3 includes the features of the MEMS system 217. When accommodated in the mount 570, the first end 225 of each of the target formation units 517_1, 517_2, and 517_3 faces a reservoir that contains target material. In the example shown, the target formation units 517_1, 517_2, and 517_3 are arranged in a linear array that extends along the Z axis. The MEMS-based target formation apparatus 516 is relatively small. For example, the orifices of each of the target formation unit 517_1, 517_2, and 517_3 may be separated from each other by about 1 mm along the Z axis.

The target formation apparatus 516 also includes a thermal insulator 565_1 between the target formation units 517_1 and 517_2, and a thermal insulator 565_2 between the target formation units 517_2 and 517_3. The material from which the target formation units 517_1, 517_2, and 517_3 are formed may have relatively high thermal conductivity. For example, the target formation units 517_1, 517_2, and 517_3 may be made of silicon. The thermal insulators 565_1 and 565_2 provide a thermal barrier or reduce the amount of thermal transfer between adjacent target formation units. This allows the target formation units 517_1, 517_2, and 517_3 to be individually controllable (for example, able to be activated or deactivated one at a time) even when the target formation units 517_1, 517_2, and 517_3 are made out of a material that is a good thermal conductor.

The thermal insulators 565_1 and 565_2 may be made from any thermally insulating material that is suitable for use in a MEMS system. For example, each of the thermal insulators 565_1 and 565_2 may be cavities filled with air, stone wool, or folded polyimide foil. In some implementations, small holes can be etched at the positions of the thermal barriers 565_1 and 565_2. A silicon dioxide or silicon layer may be placed in the etched holes. The thermal conductivity of silicon dioxide is about 5-10 W/m/K and of silicon 130 W/m/K, and a layer made of either or both of these materials provides thermal insulation. The thermal insulators 565_1 and 565_2 may be identical in shape and/or material. In some implementations, an active heating and/or cooling mechanism (such as a Peltier device) is associated with each of the target formation units 517_1, 517_2, 517_3 to actively heat or cool a particular target formation unit and to provide precise control of the temperature of each target formation unit.

The target formation apparatus 516 also includes temperature systems 563_1, 563_2, and 563_3, which are respectively associated with the target formation units 517_1, 517_2, and 517_3. In the target formation apparatus 516, the temperature systems 563_1, 563_2, and 563_3 are part of the associated target formation unit and are also fabricated in a semiconductor device fabrication technology. For example, the target formation apparatus 516 may be a monolithic part that includes the target formation units 517_1, 517_2, and 517_3, the temperature systems 563_1, 563_2, and 563_3, and the thermal insulators 565_1 and 565_2.

In operational use, the temperature systems 563_1, 563_2, and 563_3 receive control signals from the control system 450. The control signals cause the activation or deactivation of the temperature systems 563_1, 563_2, and 563_3 thus allowing a particular one of the target formation units 517_1, 517_2, and 517_3 to be activated at any given time.

The target formation apparatus 516 may be held in place in the mount 570 with, for example, O-rings or any other sealing device. When accommodated in the mount 570, a space 571 may be formed between the holder and the target formation apparatus 516. The space 571 may be at the same partial pressure as the space 234 (which holds the actuator 231) and the chamber 228.

The example of FIGS. 5A and 5B shows a supply system that includes three target formation units, each of which is an instance of the MEMS system 217. However, other configurations are possible. For example, more or fewer instances of the MEMS system 217 may be used and/or the instances may be arranged in a geometric configuration other than a linear array. MEMS systems other than the MEMS system 217 may be used in the target formation apparatus 516.

Referring to FIG. 6, a perspective view of a target formation apparatus 616 is shown. The target formation apparatus 616 is another example of an implementation of the target formation apparatus 416 (FIG. 4), and the target formation apparatus 616 may be used with the control system 450. The target formation apparatus 616 is used with an EUV light source.

The target formation apparatus 616 includes target formation units 662 that are individually controllable but are not MEMS-based. The target formation apparatus 616 includes more than two target formation units 662. The target formation units 662 are fabricated using traditional machining techniques. Each target formation unit 662 includes at least one capillary tube 671 surrounded by a piezo actuator (not shown) and fitted into a filter 673. Only one of the target formation units 662 is labeled in FIG. 6, but, as shown, the other units of the target formation apparatus 616 have similar features.

The target formation units 662 of the target formation apparatus 616 are mounted to a block 670. The block 670 is mounted into the vacuum chamber of the EUV light source (for example, the vacuum chamber 109 of FIG. 1). The block 670 is also mounted to the reservoir 112 such that target material in the pressurized reservoir may flow into the target formation units 662 and exit from an orifice of the capillary tube. The block 670 includes temperature systems (not shown) that are able to heat or cool the target material that flows toward the target formation units. Each of the target formation units 662 has an associated temperature system that is controllable with the control system 450. The control system 450 controls the temperature system to maintain the molten state of the target material of a particular target formation unit to activate that target formation unit. To deactivate a particular target formation unit or to activate that target formation unit, the control system 450 controls the associated temperature system to cool the target material until it solidifies such that target material does not flow through that target formation unit, or to heat the target material so that it flows through that target formation unit.

In some implementations, the target formation units 662 may be configured to rotate in the block 670 about an axis 677. In these implementations, the target formation units 662 are rotated relative to the block 670 to direct targets emitted from the activated target formation toward the plasma formation location 123. In other implementations, the target formation units 662 are mounted in the block 670 such that all of the target formation units 662 are aimed at the plasma formation location 123. In these implementations, the target formation units 662 do not rotate relative to the block 670. In yet another implementation, the block 670 and the target formation units 662 move together relative to the plasma formation location 123 to direct targets emitted from the activated target formation unit toward the plasma formation location 123. In this implementation, the block 670 and the target formation units 662 may rotate about the axis 677 along an arc A and/or may translate in any direction relative to the plasma formation location 123. For example, the block 670 and the target formation units 662 may move together along a path P and/or a path P'. In implementations in which the block 670 and/or the target formation units 672 move, the control system 450 may be used to control the motion.

Figure 7:
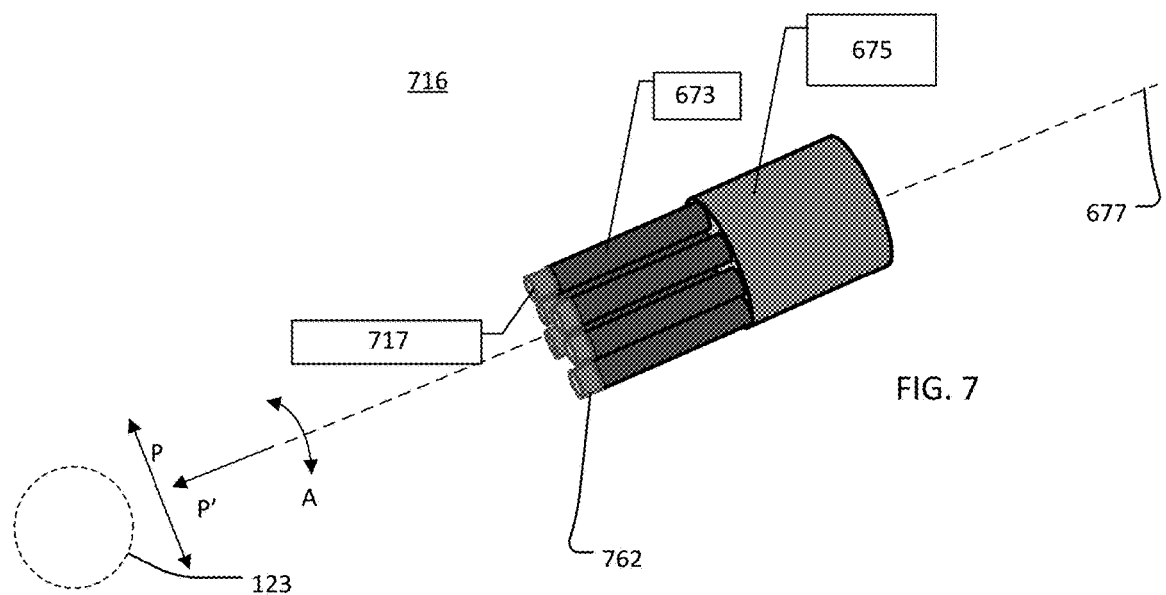

Referring to FIG. 7, a perspective view of a target formation apparatus 716 is shown. The target formation apparatus 716 is another example of an implementation of the target formation apparatus 416 (FIG. 4), and the target formation apparatus 716 may be used with the control system 450. The target formation apparatus 716 is used with an EUV light source.

The target formation apparatus 716 includes target formation units 762 that are individually controllable. Only one of the target formation units 762 is labeled in FIG. 7, but, as shown, the other units have similar features. The target formation apparatus 716 includes more than two target formation units 762. The target formation units 762 are MEMS-based and each target formation unit 762 includes a MEMS system 717. The MEMS system 717 may be similar to the MEMS system 117, 217, or 317, or the MEMS system 717 may have a different configuration. In each target formation unit 762, the MEMS system 717 is mounted onto the filter 673, which is mounted to the block 675.

Referring to FIG. 8, a perspective view of a target formation apparatus 816 is shown. The target formation apparatus 816 is another example of an implementation of the target formation apparatus 416 (FIG. 4), and the target formation apparatus 816 may be used with the control system 450. The target formation apparatus 816 is used with an EUV light source.

The target formation apparatus 816 includes target formation units 862 that are individually controllable. Only one of the target formation units 862 is labeled in FIG. 8, but, as shown, the other units have similar features. The target formation apparatus 816 includes more than two target formation units 862. The target formation units 862 are MEMS-based and each target formation unit 862 includes a MEMS system 817. The MEMS system 817 includes at least one filter and may be similar to the MEMS system 217 or 317, or the MEMS system 817 may have a different configuration. The MEMS system 817 may be fabricated as multiple orifices that are etched in a silicon wafer. In each target formation unit 862, the MEMS system 817 is mounted directly onto the block 670.

The target formation apparatus 716 and 816 may be implemented to move relative to the block 670 and/or with the block 670 similar to the implementations of the target formation apparatus 616. Additionally, the temperature systems of the block 670 and the control system 450 allow the target formation units 762 and 862 of the target formation apparatus 716 and 816, respectively, to be individually controlled as discussed with respect to the target formation apparatus 616. Moreover, more than one target formation unit may be activated at any given time such that two or more streams of targets are emitted toward the plasma formation location 123.

Figure 9:
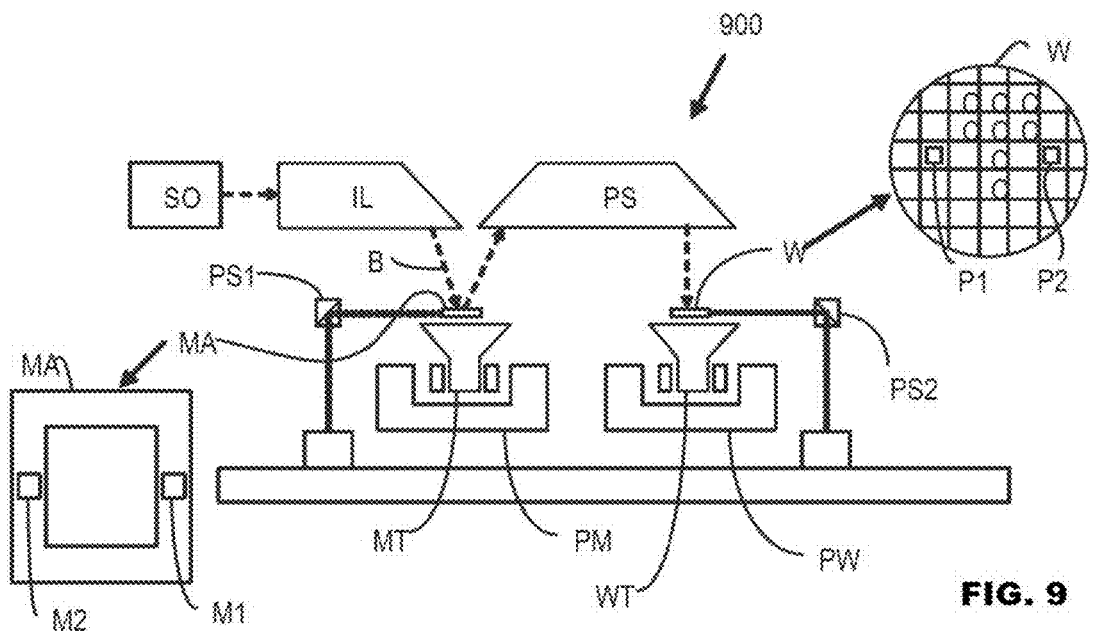
FIG. 9 is a block diagram of an example of a lithographic apparatus.

FIG. 9 schematically depicts a lithographic apparatus 900 including a source collector module SO according to one implementation. The target formation apparatuses 116, 416, 516, 616, 716, and 816 are examples of target formation apparatuses or droplet generators that may be used in the source collector module SO. The lithographic apparatus 900 includes:

an illumination system (illuminator) IL configured to condition a radiation beam B (for example, EUV radiation).

a support structure (for example, a mask table) MT constructed to support a patterning device (for example, a mask or a reticle) MA and connected to a first positioner PM configured to accurately position the patterning device;

a substrate table (for example, a wafer table) WT constructed to hold a substrate (for example, a resist-coated wafer) W and connected to a second positioner PW configured to accurately position the substrate; and a projection system (for example, a reflective projection system) PS configured to project a pattern imparted to the radiation beam B by patterning device MA onto a target portion C (for example, comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device MA in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system.

The term "patterning device" should be broadly interpreted as referring to any device that can be used to impart a radiation beam with a pattern in its cross-section such as to create a pattern in a target portion of the substrate. The pattern imparted to the radiation beam may correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The projection system PS, like the illumination system IL, may include various types of optical components, such as refractive, reflective, magnetic, electromagnetic, electrostatic or other types of optical components, or any combination thereof, as appropriate for the exposure radiation being used, or for other factors such as the use of a vacuum. It may be desired to use a vacuum for EUV radiation since other gases may absorb too much radiation. A vacuum environment may therefore be provided to the whole beam path with the aid of a vacuum wall and vacuum pumps.

As here depicted, the apparatus is of a reflective type (for example, employing a reflective mask).

The lithographic apparatus may be of a type having two (dual stage) or more substrate tables (and/or two or more patterning device tables). In such "multiple stage" machines the additional tables may be used in parallel, or preparatory steps may be carried out on one or more tables while one or more other tables are being used for exposure.

Referring to FIG. 9, the illuminator IL receives an extreme ultra violet radiation beam from the source collector module SO. Methods to produce EUV light include, but are not necessarily limited to, converting a material into a plasma state that has at least one element, for example, xenon, lithium or tin, with one or more emission lines in the EUV range. In one such method, often termed laser produced plasma ("LPP") the required plasma can be produced by irradiating a fuel, such as a droplet, stream or cluster of material having the required line-emitting element, with a laser beam. The source collector module SO may be part of an EUV radiation system including a laser, not shown in FIG. 9, for providing the laser beam exciting the fuel. The resulting plasma emits output radiation, for example, EUV radiation, which is collected using a radiation collector, disposed in the source collector module. The laser and the source collector module may be separate entities, for example when a carbon dioxide ($CO_2$) laser is used to provide the laser beam for fuel excitation.

In such cases, the laser is not considered to form part of the lithographic apparatus and the radiation beam is passed from the laser to the source collector module with the aid of a beam delivery system comprising, for example, suitable directing mirrors and/or a beam expander. In other cases the source may be an integral part of the source collector module, for example when the source is a discharge produced plasma EUV generator, often termed as a DPP source.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator IL may be used to condition the radiation beam, to have a desired uniformity and intensity distribution in its cross-section.

The radiation beam B is incident on the patterning device (for example, mask) MA, which is held on the support structure (for example, mask table) MT, and is patterned by the patterning device. After being reflected from the patterning device (for example, mask) MA, the radiation beam B passes through the projection system PS, which focuses the beam onto a target portion C of the substrate W. With the aid of the second positioner PW and position sensor PS2 (for example, an interferometric device, linear encoder or capacitive sensor), the substrate table WT can be moved accurately, for example, so as to position different target portions C in the path of the radiation beam B. Similarly, the first positioner PM and another position sensor PS1 can be used to accurately position the patterning device (for example mask) MA with respect to the path of the radiation beam B. Patterning device (for example mask) MA and substrate W may be aligned using patterning device alignment marks M1, M2 and substrate alignment marks P1, P2.

The depicted apparatus could be used in at least one of the following modes:

1. In step mode, the support structure (for example, mask table) MT and the substrate table WT are kept essentially stationary, while an entire pattern imparted to the radiation beam is projected onto a target portion C at one time (that is, a single static exposure). The substrate table WT is then shifted in the X and/or Y direction so that a different target portion C can be exposed.
2. In scan mode, the support structure (for example, mask table) MT and the substrate table WT are scanned synchronously while a pattern imparted to the radiation beam is projected onto a target portion C (that is, a single dynamic exposure). The velocity and direction of the substrate table WT relative to the support structure (for example, mask table) MT may be determined by the (de-)magnification and image reversal characteristics of the projection system PS.
3. In another mode, the support structure (for example, mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 10:
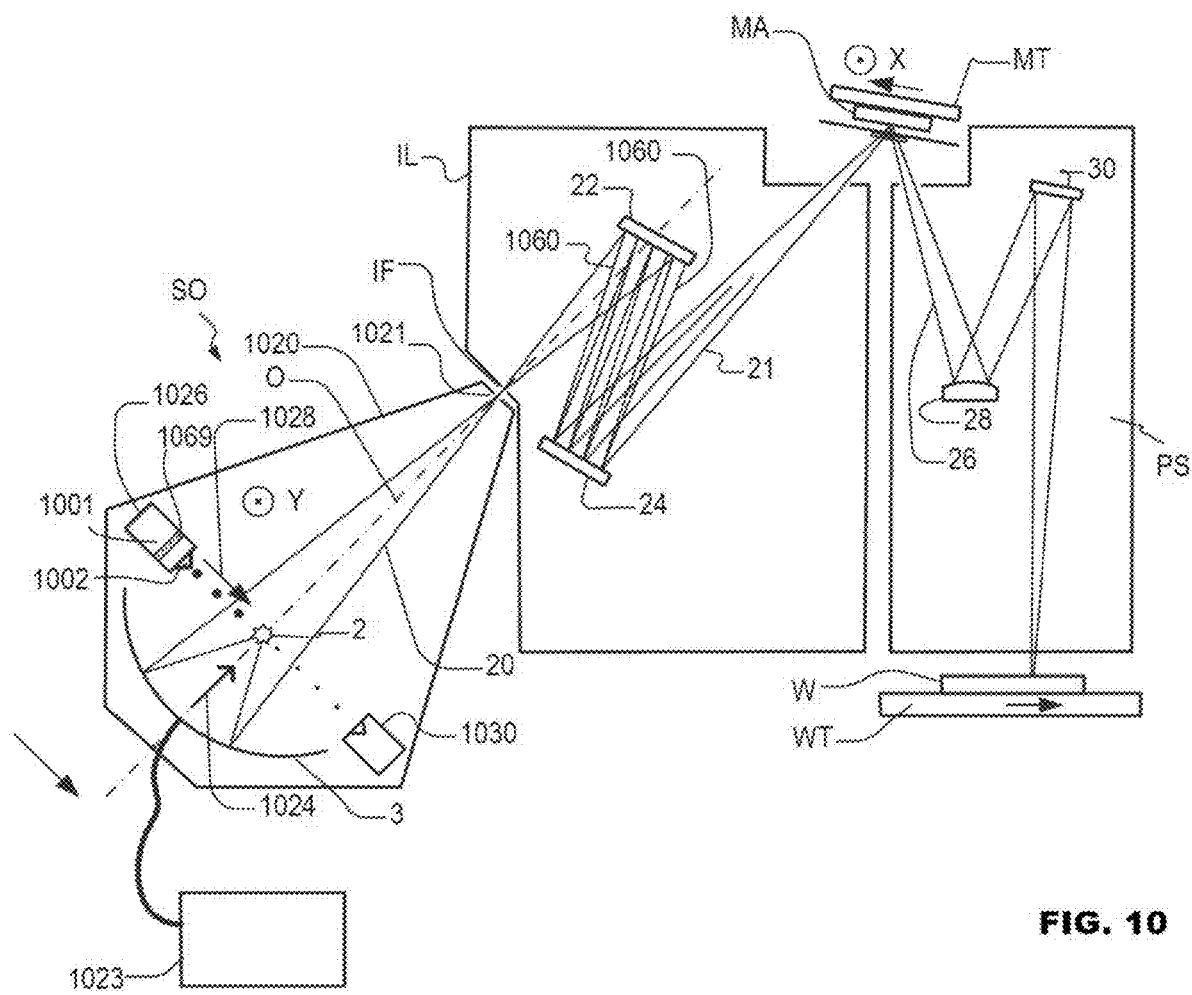
FIG. 10 is a more detailed view of the lithographic apparatus of FIG. 9.

FIG. 10 shows an embodiment of the lithographic apparatus 900 in more detail, including the source collector module SO, the illumination system IL, and the projection system PS. The source collector module SO is constructed and arranged such that a vacuum environment can be maintained in an enclosing structure 1020 of the source collector module SO. The systems IL and PS are likewise contained within vacuum environments of their own. An EUV radiation emitting plasma 2 may be formed by a laser produced LPP plasma source. The function of source collector module SO is to deliver EUV radiation beam 20 from the plasma 2 such that it is focused in a virtual source point. The virtual source point is commonly referred to as the intermediate focus (IF), and the source collector module is arranged such that the intermediate focus IF is located at or near an aperture 1021 in the enclosing structure 1020. The virtual source point IF is an image of the radiation emitting plasma 2.

From the aperture 1021 at the intermediate focus IF, the radiation traverses the illumination system IL, which in this example includes a facetted field mirror device 22 and a facetted pupil mirror device 24. These devices form a so-called "fly's eye" illuminator, which is arranged to provide a desired angular distribution of the radiation beam 21, at the patterning device MA, as well as a desired uniformity of radiation intensity at the patterning device MA (as shown by reference 1060). Upon reflection of the beam 21 at the patterning device MA, held by the support structure (mask table) MT, a patterned beam 26 is formed and the patterned beam 26 is imaged by the projection system PS via reflective elements 28, 30 onto a substrate W held by the substrate table WT. To expose a target portion C on substrate W, pulses of radiation are generated while substrate table WT and patterning device table MT perform synchronized movements to scan the pattern on patterning device MA through the slit of illumination.

Each system IL and PS is arranged within its own vacuum or near-vacuum environment, defined by enclosing structures similar to enclosing structure 1020. More elements than shown may generally be present in illumination system IL and projection system PS. Further, there may be more mirrors present than those shown. For example there may be one to six additional reflective elements present in the illumination system IL and/or the projection system PS, besides those shown in FIG. 10.

Considering source collector module SO in more detail, a laser energy source comprising laser 1023 is arranged to deposit laser energy 1024 into a fuel that includes a target material. The target material may be any material that emits EUV radiation in a plasma state, such as xenon (Xe), tin (Sn), or lithium (Li). The plasma 2 is a highly ionized plasma with electron temperatures of several 10's of electron volts (eV). Higher energy EUV radiation may be generated with other fuel materials, for example, terbium (Tb) and gadolinium (Gd). The energetic radiation generated during de-excitation and recombination of these ions is emitted from the plasma, collected by a near-normal incidence collector 3 and focused on the aperture 1021. The plasma 2 and the aperture 1021 are located at first and second focal points of collector CO, respectively.

Although the collector 3 shown in FIG. 10 is a single curved mirror, the collector may take other forms. For example, the collector may be a Schwarzschild collector having two radiation collecting surfaces. In an embodiment, the collector may be a grazing incidence collector which comprises a plurality of substantially cylindrical reflectors nested within one another.

To deliver the fuel, which, for example, is liquid tin, a droplet generator 1026 is arranged within the enclosure 1020, arranged to fire a high frequency stream 1028 of droplets towards the desired location of plasma 2. In operation, laser energy 1024 is delivered in a synchronism with the operation of droplet generator 1026, to deliver impulses of radiation to turn each fuel droplet into a plasma 2. The droplet generator 1026 may be or include any of the target formation apparatuses 116, 416, 516, 616, 716, or 816 discussed above. The frequency of delivery of droplets may be several kilohertz, for example 50 kHz. In practice, laser energy 1024 is delivered in at least two pulses: a pre pulse with limited energy is delivered to the droplet before it reaches the plasma location, in order to vaporize the fuel material into a small cloud, and then a main pulse of laser energy 1024 is delivered to the cloud at the desired location, to generate the plasma 2. A trap 1030 is provided on the opposite side of the enclosing structure 1020, to capture fuel that is not, for whatever reason, turned into plasma.

The droplet generator 1026 comprises a reservoir 1001 which contains the fuel liquid (for example, molten tin) and a filter 1069 and a nozzle 1002. The nozzle 1002 is configured to eject droplets of the fuel liquid towards the plasma 2 formation location. The droplets of fuel liquid may be ejected from the nozzle 1002 by a combination of pressure within the reservoir 1001 and a vibration applied to the nozzle by a piezoelectric actuator (not shown).

As the skilled reader will know, reference axes X, Y and Z may be defined for measuring and describing the geometry and behavior of the apparatus, its various components, and the radiation beams 20, 21, 26. At each part of the apparatus, a local reference frame of X, Y and Z axes may be defined. The Z axis broadly coincides with the direction optical axis O at a given point in the system, and is generally normal to the plane of a patterning device (reticle) MA and normal to the plane of substrate W. In the source collector module, the X axis coincides broadly with the direction of fuel stream 1028, while the Y axis is orthogonal to that, pointing out of the page as indicated in FIG. 10. On the other hand, in the vicinity of the support structure MT that holds the reticle MA, the X axis is generally transverse to a scanning direction aligned with the Y axis. For convenience, in this area of the schematic diagram FIG. 10, the X axis points out of the page, again as marked. These designations are conventional in the art and will be adopted herein for convenience. In principle, any reference frame can be chosen to describe the apparatus and its behavior.

Numerous additional components used in the operation of the source collector module and the lithographic apparatus 900 as a whole are present in a typical apparatus, though not illustrated here. These include arrangements for reducing or mitigating the effects of contamination within the enclosed vacuum, for example to prevent deposits of fuel material damaging or impairing the performance of collector 3 and other optics. Other features present but not described in detail are all the sensors, controllers and actuators involved in controlling of the various components and sub-systems of the lithographic apparatus 900.

Figure 11:
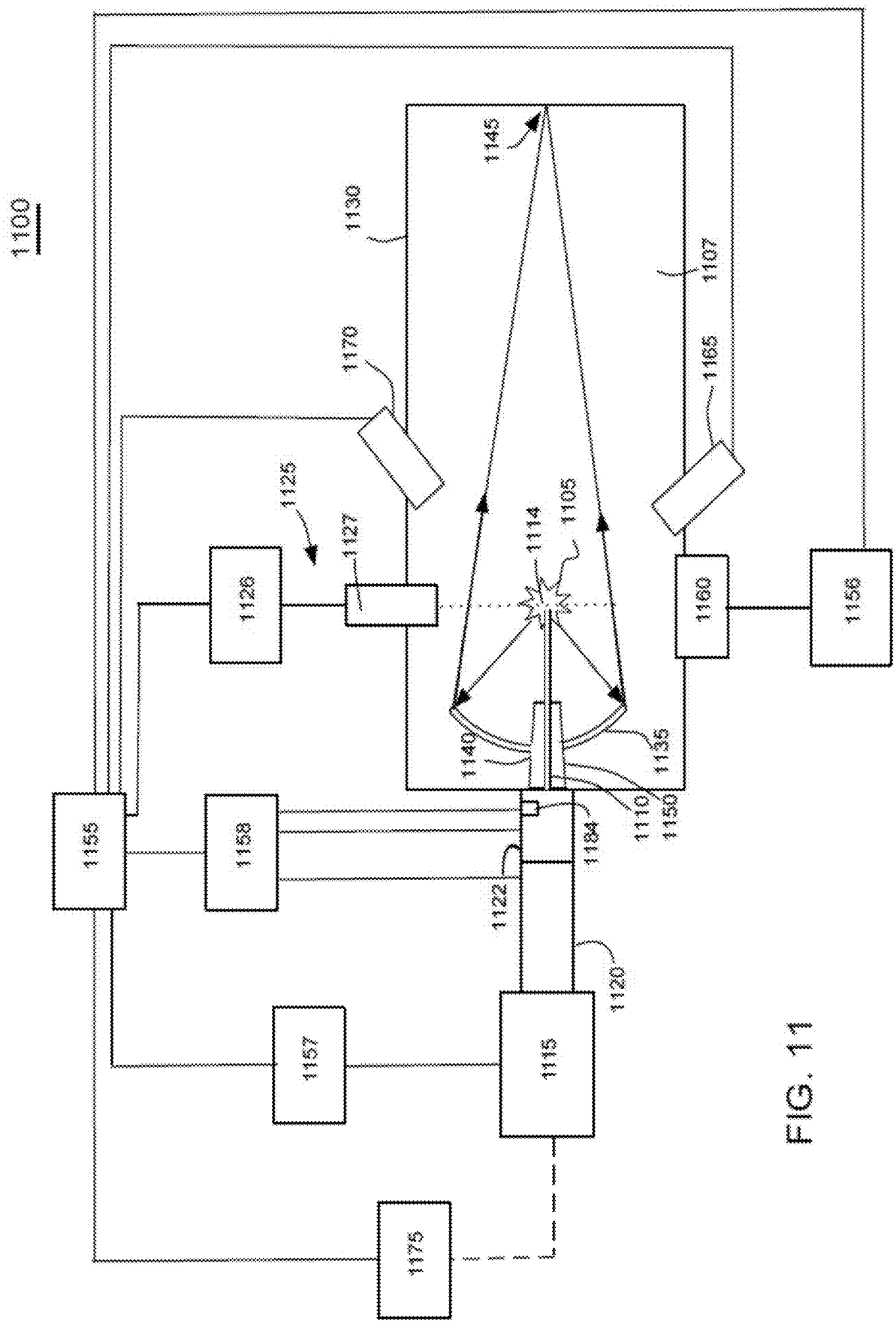
FIG. 11 is a block diagram of an example of an EUV light source.

Referring to FIG. 11, an implementation of an LPP EUV light source is shown. FIG. 11 shows a LPP EUV light source 1100. The light source 1100 may be used as the source collector module SO in the lithographic apparatus 900. Moreover, any of the target formation apparatus 116, 416, 516, 616, 716, and 816 may be used with the light source 1100. For example, any of the target formation apparatus 116, 416, 516, 616, 716, and 816 may be used with a supply system 1125 of the source 1100. Furthermore, the light source 105 of FIG. 1 may be part of the drive laser 1115, and the control system 450 may be part of the master controller 1155, any of the components of the master controller 1155, or may be implemented as a separate control system.

The LPP EUV light source 1100 is formed by irradiating a target mixture 1114 at a plasma formation location 1105 with an amplified light beam 1110 that travels along a beam path toward the target mixture 1114. The target material discussed with respect to FIGS. 1-8 may be or include the target mixture 1114. The plasma formation location 1105 is within an interior 1107 of a vacuum chamber 1130. When the amplified light beam 1110 strikes the target mixture 1114, a target material within the target mixture 1114 is converted into a plasma state that has an element with an emission line in the EUV range. The created plasma has certain characteristics that depend on the composition of the target material within the target mixture 1114. These characteristics may include the wavelength of the EUV light produced by the plasma and the type and amount of debris released from the plasma.

The light source 1100 also includes the supply system 1125 that delivers, controls, and directs the target mixture 1114 in the form of liquid droplets, a liquid stream, solid particles or clusters, solid particles contained within liquid droplets or solid particles contained within a liquid stream. The target mixture 1114 includes the target material such as, for example, water, tin, lithium, xenon, or any material that, when converted to a plasma state, has an emission line in the EUV range. For example, the element tin may be used as pure tin (Sn); as a tin compound, for example, $SnBr_4$, $SnBr_2$, $SnH_4$; as a tin alloy, for example, tin-gallium alloys, tin-indium alloys, tin-indium-gallium alloys, or any combination of these alloys. The target mixture 1114 may also include impurities such as non-target particles. Thus, in the situation in which there are no impurities, the target mixture 1114 is made up of only the target material. The target mixture 1114 is delivered by the supply system 1125 into the interior 1107 of the chamber 1130 and to the plasma formation location 1105.

The light source 1100 includes a drive laser system 1115 that produces the amplified light beam 1110 due to a population inversion within the gain medium or mediums of the laser system 1115. The light source 1100 includes a beam delivery system between the laser system 1115 and the plasma formation location 1105, the beam delivery system including a beam transport system 1120 and a focus assembly 1122. The beam transport system 1120 receives the amplified light beam 1110 from the laser system 1115, and steers and modifies the amplified light beam 1110 as needed and outputs the amplified light beam 1110 to the focus assembly 1122. The focus assembly 1122 receives the amplified light beam 1110 and focuses the beam 1110 to the plasma formation location 1105.

In some implementations, the laser system 1115 may include one or more optical amplifiers, lasers, and/or lamps for providing one or more main pulses and, in some cases, one or more pre-pulses. Each optical amplifier includes a gain medium capable of optically amplifying the desired wavelength at a high gain, an excitation source, and internal optics. The optical amplifier may or may not have laser mirrors or other feedback devices that form a laser cavity. Thus, the laser system 1115 produces an amplified light beam 1110 due to the population inversion in the gain media of the laser amplifiers even if there is no laser cavity. Moreover, the laser system 1115 may produce an amplified light beam 1110 that is a coherent laser beam if there is a laser cavity to provide enough feedback to the laser system 1115. The term "amplified light beam" encompasses one or more of: light from the laser system 1115 that is merely amplified but not necessarily a coherent laser oscillation and light from the laser system 1115 that is amplified and is also a coherent laser oscillation.

The optical amplifiers in the laser system 1115 may include as a gain medium a filling gas that includes $CO_2$ and may amplify light at a wavelength of between about 9100 and about 11000 nm, and in particular, at about 10600 nm, at a gain greater than or equal to 800 times. Suitable amplifiers and lasers for use in the laser system 1115 may include a pulsed laser device, for example, a pulsed, gas-discharge $CO_2$ laser device producing radiation at about 9300 nm or about 10600 nm, for example, with DC or RF excitation, operating at relatively high power, for example, 10 kW or higher and high pulse repetition rate, for example, 40 kHz or more. The pulse repetition rate may be, for example, 50 kHz. The optical amplifiers in the laser system 1115 may also include a cooling system such as water that may be used when operating the laser system 1115 at higher powers.

The light source 1100 includes a collector mirror 1135 having an aperture 1140 to allow the amplified light beam 1110 to pass through and reach the plasma formation location 1105. The collector mirror 1135 may be, for example, an ellipsoidal mirror that has a primary focus at the plasma formation location 1105 and a secondary focus at an intermediate location 1145 (also called an intermediate focus) where the EUV light may be output from the light source 1100 and may be input to, for example, an integrated circuit lithography tool (not shown). The light source 1100 may also include an open-ended, hollow conical shroud 1150 (for example, a gas cone) that tapers toward the plasma formation location 1105 from the collector mirror 1135 to reduce the amount of plasma-generated debris that enters the focus assembly 1122 and/or the beam transport system 1120 while allowing the amplified light beam 1110 to reach the plasma formation location 1105. For this purpose, a gas flow may be provided in the shroud that is directed toward the plasma formation location 1105.

The light source 1100 may also include a master controller 1155 that is connected to a droplet position detection feedback system 1156, a laser control system 1157, and a beam control system 1158. The light source 1100 may include one or more target or droplet imagers 1160 that provide an output indicative of the position of a droplet, for example, relative to the plasma formation location 1105 and provide this output to the droplet position detection feedback system 1156, which may, for example, compute a droplet position and trajectory from which a droplet position error may be computed either on a droplet by droplet basis or on average. The droplet position detection feedback system 1156 thus provides the droplet position error as an input to the master controller 1155. The master controller 1155 may therefore provide a laser position, direction, and timing correction signal, for example, to the laser control system 1157 that may be used, for example, to control the laser timing circuit and/or to the beam control system 1158 to control an amplified light beam position and shaping of the beam transport system 1120 to change the location and/or focal power of the beam focal spot within the chamber 1130.

The supply system 1125 includes a target material delivery control system 1126 that is operable, in response to a signal from the master controller 1155, for example, to modify the release point of the droplets as released by a target material supply apparatus 1127 to correct for errors in the droplets arriving at the desired plasma formation location 1105.

Additionally, the light source 1100 may include light source detectors 1165 and 1170 that measures one or more EUV light parameters, including but not limited to, pulse energy, energy distribution as a function of wavelength, energy within a particular band of wavelengths, energy outside of a particular band of wavelengths, and angular distribution of EUV intensity and/or average power. The light source detector 1165 generates a feedback signal for use by the master controller 1155. The feedback signal may be, for example, indicative of the errors in parameters such as the timing and focus of the laser pulses to properly intercept the droplets in the right place and time for effective and efficient EUV light production.

The light source 1100 may also include a guide laser 1175 that may be used to align various sections of the light source 1100 or to assist in steering the amplified light beam 1110 to the plasma formation location 1105. In connection with the guide laser 1175, the light source 1100 includes a metrology system 1124 that is placed within the focus assembly 1122 to sample a portion of light from the guide laser 1175 and the amplified light beam 1110. In other implementations, the metrology system 1124 is placed within the beam transport system 1120. The metrology system 1124 may include an optical element that samples or re-directs a subset of the light, such optical element being made out of any material that may withstand the powers of the guide laser beam and the amplified light beam 1110. A beam analysis system is formed from the metrology system 1124 and the master controller 1155 since the master controller 1155 analyzes the sampled light from the guide laser 1175 and uses this information to adjust components within the focus assembly 1122 through the beam control system 1158.

Thus, in summary, the light source 1100 produces an amplified light beam 1110 that is directed along the beam path to irradiate the target mixture 1114 at the plasma formation location 1105 to convert the target material within the mixture 1114 into plasma that emits light in the EUV range. The amplified light beam 1110 operates at a particular wavelength (that is also referred to as a drive laser wavelength) that is determined based on the design and properties of the laser system 1115. Additionally, the amplified light beam 1110 may be a laser beam when the target material provides enough feedback back into the laser system 1115 to produce coherent laser light or if the drive laser system 1115 includes suitable optical feedback to form a laser cavity.

Other implementations are within the scope of the claims. For example, and as noted above, other implementations of the MEMS system 117 (FIG. 1) are possible. These other implementations of the MEMS system 117 may be used as the MEMS system 117 in the target formation apparatus 116 and the supply system 110. Moreover, other implementations of the MEMS system 117 may be used in the target formation apparatus 416 (FIG. 4). For example, an instance of another implementations of the MEMS system 117 may be used as a target formation unit 462.

Figure 12A:
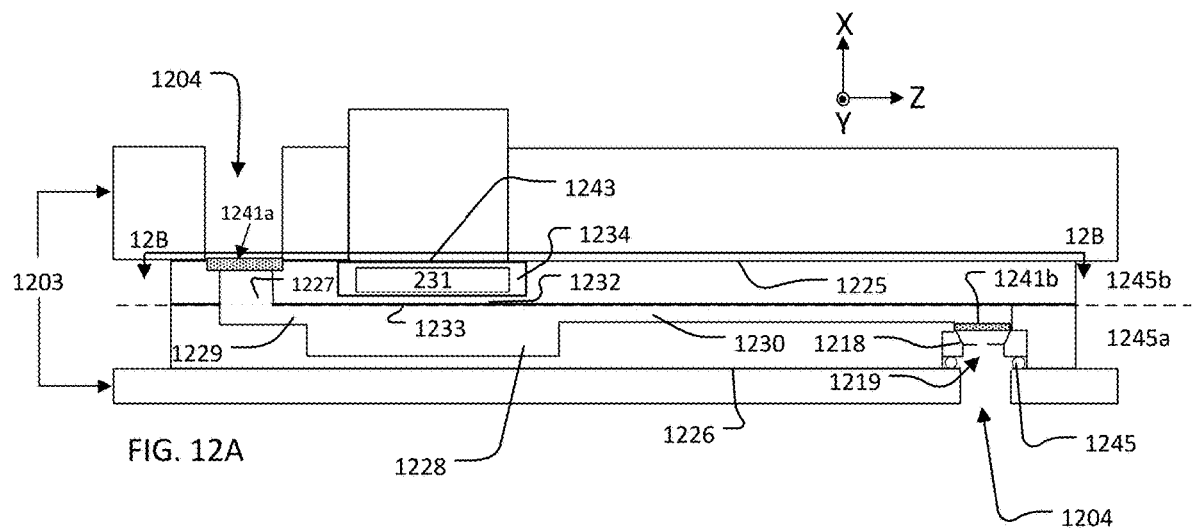
FIG. 12A is a block diagram of a side cross-sectional view of another example of a MEMS system that may be used with the supply system of FIG. 1.
Figure 12B:
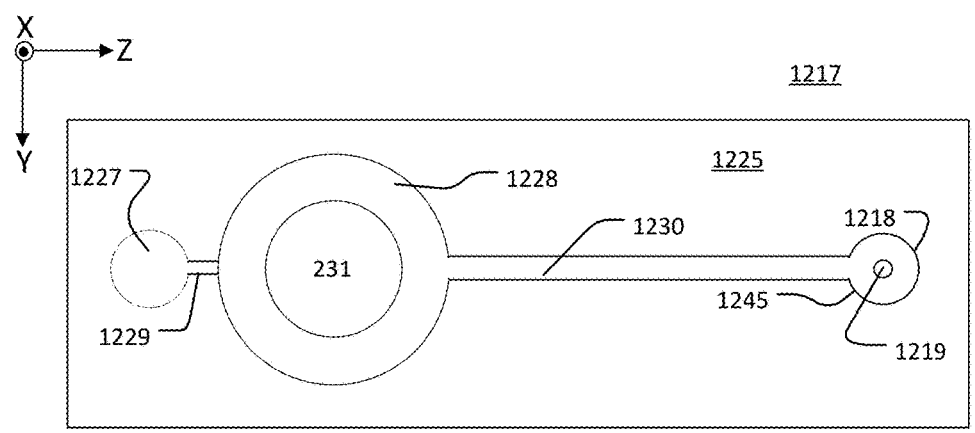
FIG. 12B is a block diagram of a top view of the MEMS system of FIG. 12A.

FIGS. 12A and 12B show a MEMS system 1217 fabricated in a semiconductor device fabrication technology. The MEMS system 1217 is an implementation of the MEMS system 117. FIG. 12A is a block diagram of a side cross-sectional view of the MEMS system 1217 in the X-Z plane. In FIG. 12A, the MEMS system 1217 is accommodated in a mount 1203. FIG. 12B is a block diagram of a top view of the MEMS system 1217 in the Y-Z plane as seen from the line 12B-12B.

The MEMS system 1217 includes a first end 1225 and a second end 1226. In the MEMS system 1217, the first end 1225 and the second end 1226 are at opposing sides. The MEMS system 1217 is accommodated in the mount 1203. The mount 1203 is a clamp that holds the MEMS system 1217 at the first end 1225 and the second end 1226. The mount 1203 applies force to the MEMS system 1217 along the X axis. The mount 1203 includes openings 1204 to allow target material to enter and exit the MEMS system 1217. The mount 1203 may be sealed to the MEMS system 1217. In the example of FIG. 12A, a seal 1245 seals a nozzle 1218 of the MEMS system 1217 to the mount 1203. The seal 1245 may be, for example, an O-ring seal or any other type of mechanism capable of sealing the nozzle 1218 to the mount 1203.

A first channel 1227 extends from the first end 1225 along the X axis. In operational use, target material flows from a pressurized reservoir (such as the reservoir 112 of FIG. 1) into the opening 1204 through a filter 1241a and into the first channel 1227. The first channel 1227 is fluidly coupled to a chamber 1228 via an intermediate channel 1229. The chamber 1228 is partially formed by a wall 1233. The chamber 1228 is fluidly coupled to a second channel 1230, which extends away from the chamber 1228 along the Z axis. Thus, in the MEMS system 1217, the first channel 1227 and the second channel 1230 are perpendicular to each other. The second channel 1230 is fluidly coupled to the nozzle 1218, which extends along the X axis. The nozzle defines an orifice 1219.

Together, the first channel 1227, the intermediate channel 1229, the chamber 1228, the second channel 1230, and the orifice form a target material path from the first end 1225 to the second end 1226. The MEMS system 1217 includes just one first channel 1227, and the target material that flows in the MEMS system 1217 may be more localized within the MEMS system 1217 as compared to an implementation that includes more than one first channel. Thus, the temperature of the MEMS system 1217 may be easier to control when, for example, the MEMS system 1217 is used as a target formation unit in a supply system that includes multiple target formation units that are individually controllable.

When the MEMS system 1217 is fluidly coupled to the pressurized reservoir 112, target material flows from the reservoir 112 through the filter 1241a, into the first channel 1227 and the intermediate channel 1229, and then into the chamber 1228. From the chamber 1228, the target material flows into the second channel 1230 and the nozzle 1218 and passes through a filter 1241b. The filters 1241a and 1241b may be similar to any of the filters discussed above. After passing through the filter 1241b, the target material is emitted from the orifice 1219.

The MEMS system 1217 also includes the actuator 231 in a space 1234. The actuator 231 is coupled to the chamber 1228 and is configured to modulate a pressure in the chamber 1228. The actuator 231 is mechanically coupled to the chamber 1228 through a membrane 1232. The actuator 231 contacts a wall 1243, which is on an opposite side of the space 1234 from the membrane 1232. The wall 1243 may be pressed against the actuator 231 in the −X direction to more firmly mechanically couple the actuator 231 to the membrane 1232.

FIG. 12A shows the MEMS system 1217 in an assembled state. The MEMS system 1217 is formed from two layers 1245a and 1245b. The boundary between the layers is shown in FIG. 12A with a dashed line that extends in the Z axis. The layers 1245a and 1245b may be fabricated separately and are joined to form the assembled MEMS system 1217. The MEMS system 1217 includes just two layers and may be simpler to manufacture as compared to an implementation that includes more layers.

Figure 13A:
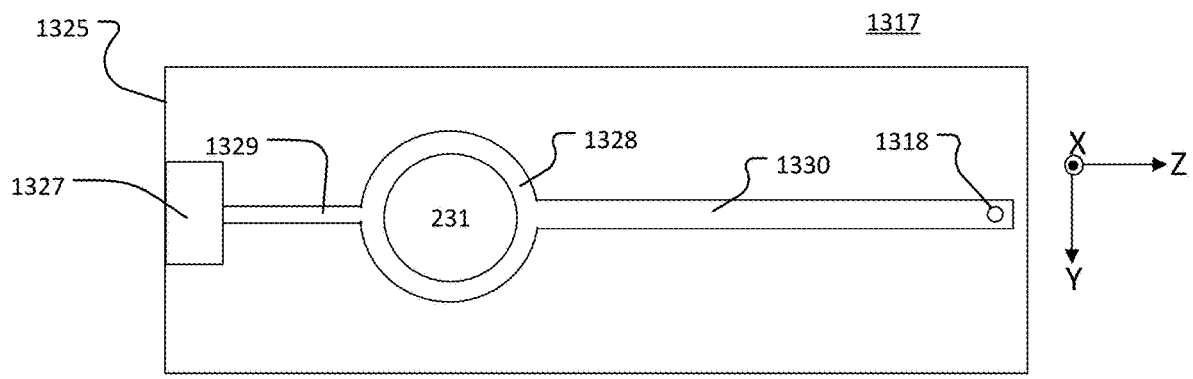
FIGS. 13A and 13B are block diagrams of another example of a MEMS system that may be used with the supply system of FIG. 1.
Figure 13B:
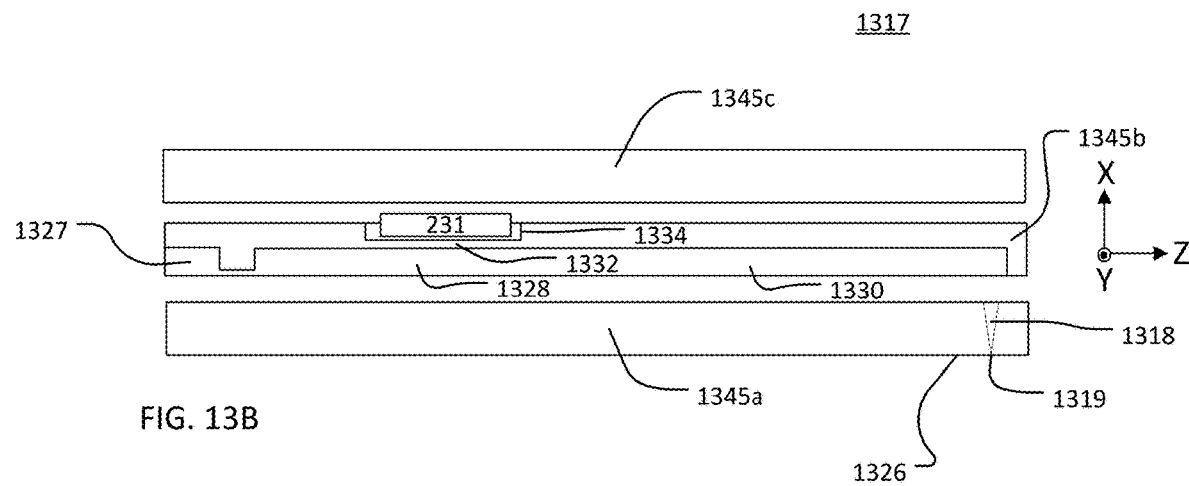

FIGS. 13A and 13B show a MEMS system 1317, which is another example of an implementation of the MEMS system 117. FIG. 13A is a cross-sectional block diagram of the MEMS system 1317 in the Y-Z plane. FIG. 13B is a cross-sectional block diagram of the MEMS system 1317 in the X-Z plane. FIG. 13B shows layers 1345a, 1345b, and 1345c of the MEMS system 1317.

The MEMS system 1317 includes a first channel 1327 that extends along the Z axis from a first end 1325. The first channel 1327 is fluidly coupled to an intermediate channel 1329, a chamber 1328, and a second channel 1330, all of which extend along the Z axis. The second channel 1330 is fluidly coupled to a nozzle 1318, which extends along the X axis (into the page in FIG. 13A). The nozzle 1318 defines an orifice 1319. The MEMS system 1317 also includes an actuator 231 in a space 1334. The actuator 231 is mechanically coupled to the chamber 1328 through a membrane 1332. The actuator 231 is configured to modulate a pressure in the chamber 1328.

In operational use, the first channel 1327 receives target material from a pressurized reservoir, such as the reservoir 112 of FIG. 1. The target material flows from the first channel 1327 into the intermediate channel 1329 and the chamber 1328. The target material flows from the chamber 1328 into the second channel 1330. Together the first channel 1327, the intermediate channel 1329, the chamber 1328, the second channel 1330, and the orifice 1319 form a target material path through the MEMS system 1317 from the first end 1325 (FIG. 13A) to a second end 1326 (FIG. 13B). In the implementation of FIGS. 13A and 13B, the first end 1325 and the second end 1326 are not at opposing sides of the MEMS system 1317. Instead, the first end 1325 is at a side of the MEMS system 1317 that extends in in the X-Y plane, and the second end 1326 is at a side of the MEMS system 1317 that extends in the Y-Z plane.

What is claimed is:

1. An apparatus for an extreme ultraviolet (EUV) light source, the apparatus comprising:
    a micromechanical (MEMS) system comprising:
        a MEMS nozzle structure comprising an orifice; and
        a channel configured to fluidly couple the orifice to a reservoir configured to contain target material that produces EUV light in a plasma state, wherein the apparatus is configured to be accommodated in a housing of a target supply system.

2. The apparatus of claim 1, wherein the MEMS system further comprises one or more filters in the channel.

3. The apparatus of claim 2, wherein each of the one or more filters comprises a filtration surface that comprises a plurality of openings, the openings are configured to allow the target material to pass, and the filtration surface is configured to capture particles that are larger than the diameter of the openings.

4. The apparatus of claim 3, wherein the openings have a diameter that is smaller than a diameter of the orifice.

5. The apparatus of claim 1, wherein the MEMS system comprises one or more of silicon, silicon carbide, silicon nitride, and silicon dioxide.

6. The apparatus of claim 5, wherein the MEMS system further comprises a nitride coating.

7. The apparatus of claim 1, wherein the apparatus is a monolithic structure.

8. The apparatus of claim 7, wherein the apparatus comprises a plurality of individually controllable MEMS systems, each of the MEMS systems comprising:
    a nozzle structure comprising an orifice; and
    a channel configured to fluidly couple the orifice to a reservoir; and
    wherein the plurality of MEMS systems are arranged in a linear array that extends along a first direction.

9. The apparatus of claim 8, wherein at least a portion of the channel of each of the MEMS systems is oriented in a second direction that is perpendicular to the first direction, and the apparatus further comprises a temperature system associated with each MEMS system.

10. The apparatus of claim 1, wherein the MEMS system is a single or unitary piece.

11. The apparatus of claim 10, wherein the MEMS system further comprises:
    one or more filters in the channel; and
    an actuator.

12. The apparatus of claim 1, wherein the MEMS system further comprises: a chamber in fluid communication with the channel; and an actuator that is coupled to the chamber, and wherein the actuator is configured to modulate a pressure in the chamber.

13. The apparatus of claim 12, wherein the MEMS system further comprises a conduit configured to control a pressure at the actuator to be approximately the same as the pressure in the chamber.

14. The apparatus of claim 1, wherein the channel extends from a first end of the MEMS system to a second end of the MEMS system, the second end is near the orifice, and the second end comprises an electrically conductive coating configured to remove accumulated charge.

15. The apparatus of claim 14, wherein the electrically conductive coating comprises silicon dioxide, silicon monoxide, molybdenum, tungsten, tantalum, iridium, or chromium.

16. The apparatus of claim 1, wherein the MEMS system is fabricated in a plurality of layers that are permanently joined.

17. The apparatus of claim 1, wherein the apparatus comprises a plurality of individually controllable MEMS systems, each of the MEMS systems comprising:
    a nozzle structure comprising an orifice; and
    a channel configured to fluidly couple the orifice to a reservoir.

18. The apparatus of claim 17, further comprising one or more thermal insulators, and at least one of the one or more thermal insulators is located between any two adjacent MEMS systems.

19. The apparatus of claim 1, wherein the MEMS system includes a plurality of MEMS layers, at least one MEMS layer corresponding to the MEMS nozzle structure and at least one layer corresponding to the channel.

20. A supply system for an extreme ultraviolet (EUV) light source, the supply system comprising:
   a housing; and
   an apparatus configured to be accommodated in the housing, the apparatus comprising a plurality of MEMS systems, and wherein each of the MEMS systems comprises:
      a nozzle structure comprising an orifice configured to emit target material to a plasma formation location; and
      a channel configured to fluidly couple the orifice to a reservoir configured to contain target material that produces EUV light in a plasma state.

21. The supply system of claim 20, further comprising: a control system configured to select a particular one of the MEMS systems for emitting the target material to the plasma formation location.

22. The supply system of claim 21, wherein the apparatus comprises one or more temperature systems coupled to the control system, each of the one or more temperature systems is associated with one respective MEMS system, and the control system is further configured to activate or deactivate a particular MEMS system by activating or deactivating the temperature system associated with the particular MEMS system.

23. An extreme ultraviolet (EUV) light source comprising:
   an optical source configured to produce an optical beam;
   a vessel configured to receive the optical beam at a plasma formation location; and
   a supply system comprising:
      a housing; and
      an apparatus configured to be accommodated in the housing, the apparatus comprising one or more MEMS systems, and wherein each of the one or more MEMS systems comprises:
         a MEMS nozzle structure comprising an orifice configured to emit target material to the plasma formation location; and
         a channel configured to fluidly couple the orifice to a reservoir configured to contain target material that produces EUV light in a plasma state.

24. A method for forming an apparatus for an extreme ultraviolet (EUV) light source, the method comprising:
   fabricating a MEMS system using a semiconductor device fabrication technology, the MEMS system being a unitary structure, wherein fabricating the MEMS system comprises:
      fabricating, using semiconductor device fabrication technology, a MEMS nozzle structure comprising an orifice; and
      fabricating, using semiconductor device fabrication technology, a channel configured to fluidly couple the orifice to a reservoir configured to contain target material that produces EUV light in a plasma state, wherein the apparatus is configured to be accommodated in a housing of a target supply system.

25. The method of claim 24, wherein the semiconductor device fabrication technology comprises one or more of wet etching, dry etching, and deposition.

26. The method of claim 25, wherein dry etching comprises one or more of reactive ion etching, electro discharge machining, and focused ion beam etching.

27. The method of claim 25, wherein deposition comprises chemical vapor deposition.

28. The method of claim 27, wherein chemical vapor deposition comprises one or more of atmospheric pressure chemical vapor deposition, atomic layer chemical vapor deposition, hot filament chemical vapor deposition, low-pressure chemical vapor deposition, metal organic chemical vapor deposition, microwave plasma-assisted chemical vapor deposition, plasma enhanced chemical vapor deposition, rapid thermal chemical vapor deposition, remote plasma enhanced chemical vapor deposition, and ultra-high vacuum chemical vapor deposition.

* * * * *

UNITED STATES PATENT AND TRADEMARK OFFICE
CERTIFICATE OF CORRECTION

PATENT NO. : 10,904,994 B2
APPLICATION NO. : 16/671348
DATED : January 26, 2021
INVENTOR(S) : Winkels et al.

It is certified that error appears in the above-identified patent and that said Letters Patent is hereby corrected as shown below:

In the Claims

Column 29, Line 56, In Claim 1, Line 3, "micromechanical (MEMS)" should read --microelectromechanical (MEMS)--.

Signed and Sealed this
Ninth Day of March, 2021

Drew Hirshfeld
*Performing the Functions and Duties of the*
*Under Secretary of Commerce for Intellectual Property and*
*Director of the United States Patent and Trademark Office*